United States Patent
Ito et al.

(10) Patent No.: US 12,269,733 B2
(45) Date of Patent: Apr. 8, 2025

(54) INERTIAL SENSOR AND METHOD FOR MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Keitaro Ito, Nisshin (JP); Shota Harada, Nisshin (JP); Katsuaki Goto, Nisshin (JP); Yuuki Inagaki, Nisshin (JP); Teruhisa Akashi, Nisshin (JP); Hirofumi Funabashi, Nisshin (JP); Takahiko Yoshida, Nisshin (JP); Yusuke Kawai, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 375 days.

(21) Appl. No.: 17/703,418

(22) Filed: Mar. 24, 2022

(65) Prior Publication Data

US 2022/0315411 A1  Oct. 6, 2022

(30) Foreign Application Priority Data

Mar. 30, 2021  (JP) .................................. 2021-057615
Oct. 26, 2021  (JP) .................................. 2021-174533

(51) Int. Cl.
  *B81C 1/00*  (2006.01)
  *B81B 3/00*  (2006.01)
  *B81C 3/00*  (2006.01)

(52) U.S. Cl.
  CPC ............ *B81B 3/0021* (2013.01); *B81C 3/001* (2013.01); *B81B 2201/0235* (2013.01); *B81B 2201/0242* (2013.01); *B81C 2203/0172* (2013.01)

(58) Field of Classification Search
  CPC .......... B81B 3/0021; B81B 2201/0235; B81B 2201/0242; B81B 3/0064;
  (Continued)

(56) References Cited

U.S. PATENT DOCUMENTS 6,785,117 B2 * 8/2004 Sakai .................... G01P 15/125
                                                       361/287
8,631,702 B2   1/2014 Horning et al.
(Continued)

OTHER PUBLICATIONS

Serial No. U.S. Appl. No. 17/703,164, filed Mar. 24, 2022, Harada et al.
(Continued)

*Primary Examiner* — Sheikh Maruf
(74) *Attorney, Agent, or Firm* — Posz Law Group, PLC

(57) ABSTRACT

A micro vibration body includes a curved surface portion, which has an annular curved surface, and a recessed portion, which is recessed from the curved surface portion. A mounting substrate includes an inner frame portion and electrode portions, which surround an inner frame portion. A joining member is provided in an inner region of the mounting substrate surrounded by the inner frame portion. The recessed portion of the micro vibration body has a bottom surface defining a mounted surface located in the inner region and joined to the mounting substrate via the joining member. The curved surface portion has a rim that includes an end portion of the curved surface portion on an opposite side to the recessed portion. The rim has a rim lower surface located on a same plane as the mounted surface or a tip end portion of the mounted surface.

6 Claims, 25 Drawing Sheets

(58) Field of Classification Search
CPC ............ B81B 2201/0228; B81C 3/001; B81C 2203/0172; B81C 1/00134; B81C 1/00642; G01C 19/5691; G01C 21/166; G01P 15/125
USPC .......................................................... 257/95
See application file for complete search history.

(56) References Cited

U.S. PATENT DOCUMENTS

| | | | |
|---|---|---|---|
| 10,532,943 B2 | 1/2020 | Najafi et al. | |
| 10,612,925 B2 | 4/2020 | Najafi et al. | |
| 2002/0158039 A1* | 10/2002 | Harris | B81C 1/00626 216/75 |
| 2005/0277217 A1* | 12/2005 | Kouma | B81C 1/00626 438/48 |
| 2007/0119258 A1* | 5/2007 | Yee | G01H 13/00 73/649 |
| 2010/0024560 A1* | 2/2010 | Shcheglov | G01C 19/5684 156/64 |
| 2010/0220551 A1* | 9/2010 | Akiyama | G01S 7/539 367/99 |
| 2010/0225203 A1* | 9/2010 | Sougawa | G02B 7/08 310/323.02 |
| 2011/0183455 A1* | 7/2011 | Wang | B81C 1/00246 438/51 |
| 2011/0239763 A1* | 10/2011 | Shkel | B29C 44/02 216/33 |
| 2011/0290021 A1 | 12/2011 | Horning et al. | |
| 2011/0309722 A1* | 12/2011 | Seki | H02N 2/12 310/323.16 |
| 2013/0093031 A1* | 4/2013 | Gao | H01L 23/047 438/51 |
| 2013/0127301 A1* | 5/2013 | Osawa | G01F 1/662 310/366 |
| 2013/0160578 A1* | 6/2013 | Najafi | G01C 19/28 74/5.6 D |
| 2013/0267049 A1* | 10/2013 | Robert | B81C 1/00801 438/22 |
| 2014/0068931 A1 | 3/2014 | Horning et al. | |
| 2015/0336790 A1* | 11/2015 | Geen | G01P 15/0802 257/415 |
| 2016/0047653 A1* | 2/2016 | Shkel | G01C 19/5691 73/504.13 |
| 2016/0173001 A1* | 6/2016 | Langa | B81B 3/0021 438/22 |
| 2018/0188030 A1 | 7/2018 | Shang et al. | |
| 2019/0094024 A1* | 3/2019 | Najafi | G01C 19/5691 |
| 2020/0309527 A1* | 10/2020 | Shkel | B81C 1/00182 |
| 2022/0049959 A1* | 2/2022 | Wu | B81C 3/001 |
| 2022/0090917 A1* | 3/2022 | Najafi | G01C 19/005 |

OTHER PUBLICATIONS

Tal Rove Nagourney, "High-Q Fused Silica Micro-Shell Resonators for Navigation-Grade MEMS Gyroscopes." 2018. University of Michigan PhD dissertation.

* cited by examiner

INERTIAL SENSOR AND METHOD FOR MANUFACTURING THE SAME

CROSS REFERENCE TO RELATED APPLICATION

The present application claims the benefit of priority from Japanese Patent Applications No. 2021-57615 filed on Mar. 30, 2021 and No. 2021-174533 filed on Oct. 26, 2021. The entire disclosures of all of the above applications are incorporated herein by reference.

TECHNICAL FIELD

The present disclosure relates to an inertial sensor including a micro vibration body and a method for manufacturing the inertial sensor.

BACKGROUND

In recent years, a system for driving of a vehicle has been developed.

SUMMARY

According to an aspect of the present disclosure, an inertial sensor comprises a micro vibration body and a mounting substrate.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
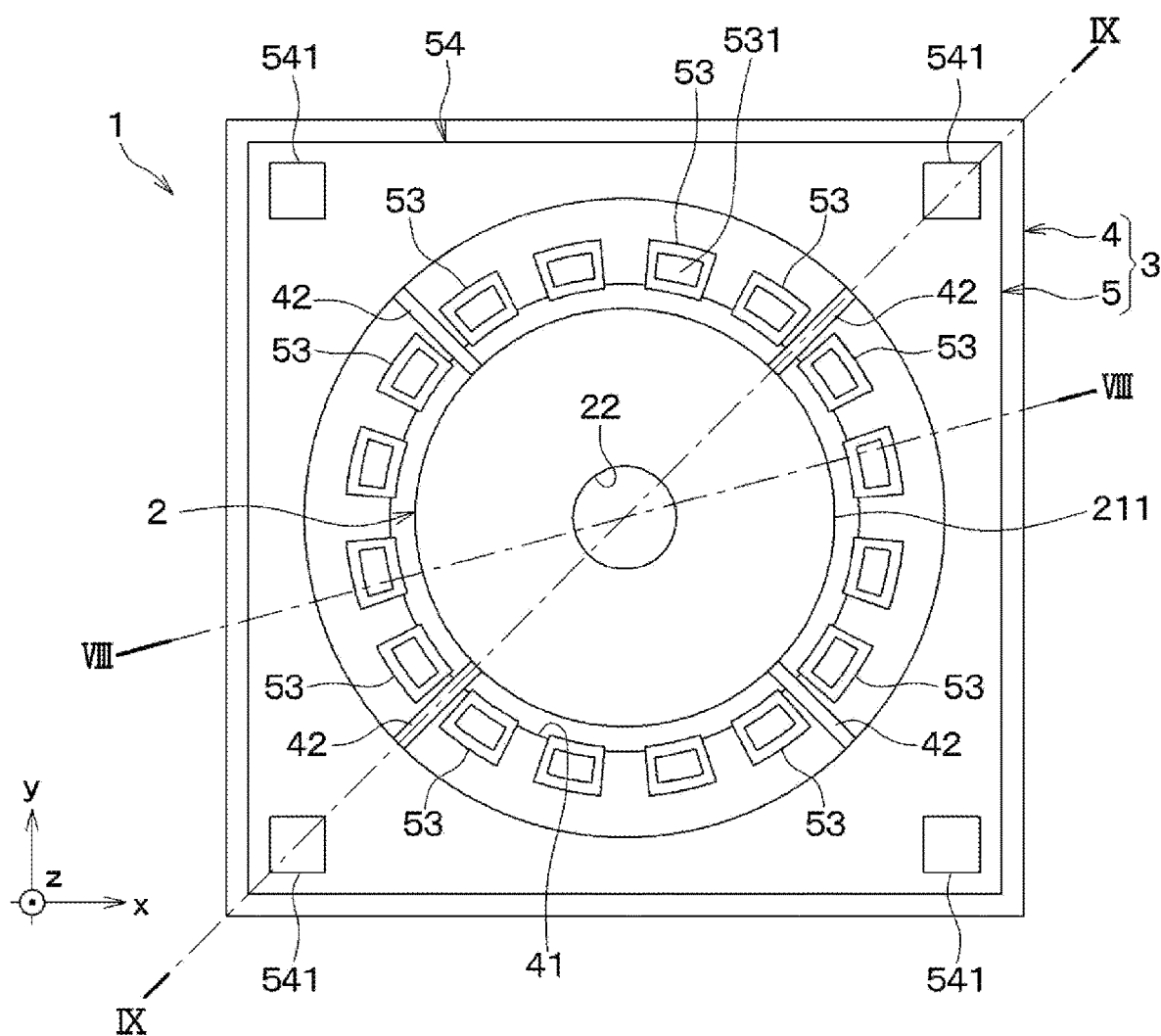
FIG. 1 is a top view showing an inertial sensor according to a first embodiment.

Hereinafter, examples of the present disclosure will be described.

A system for autonomous driving of a vehicle generally requires a highly accurate self-position estimation technology.

According to an example of the present disclosure, a self-position estimation system equipped with GNSS (Global Navigation Satellite System) and IMU (Inertial Measurement Unit) is used for so-called level 3 automated driving. The IMU is, for example, a 6-axis inertial sensor composed of a 3-axis gyro sensor and a 3-axis acceleration sensor. In the future, in order to realize a level 4 or higher autonomous operation, IMU with higher sensitivity than the current system is required.

As a gyro sensor for realizing such a high-sensitivity IMU, for example, BRG (Bird-bath Resonator Gyroscope) may be used. The BRG includes a micro vibration body having a three-dimensional curved surface, which vibrates in a wine glass mode, and is mounted on a mounting substrate. This micro vibration body has a Q factor, which represents a vibration state and which reaches $10^6$ or more. Therefore, it is expected that this micro vibration body enables to produce a higher sensitivity than a previous configuration.

According to an example of the present disclosure, this micro vibration body is, for example, formed by setting a plate material, such as quartz, which is adapted to reflow process caused by heating, in a mold, then the plate material is melted and solidified. As a result, a three-dimensional curved surface that vibrates in the wine glass mode is formed. After the plate material treated with the above process, the plate material is covered with a sealing material. Further, unnecessary portions are polished and removed by CMP (Chemical Mechanical Polishing) and/or the like. Thus, the micro vibration body has a configuration including a mounting part, which is to be joined to a mounting substrate, and a three-dimensional shape part, which is hollow when mounted on the mounting substrate. Further, this micro vibration body includes an electrode film covering the front and back surfaces of the micro vibration body. Further, this micro vibration body is arranged at a distance from multiple electrodes formed on the mounting substrate to which the micro vibration body is to be mounted, thereby to form a capacitor therebetween.

The BRG includes a mounting substrate having a plurality of electrode portions, which are arranged in a ring shape and are at a distance from each other, and a micro vibration body (BR), which serves as a resonator and is mounted on the mounting substrate, such that a rim of the BRG becomes hollow. It is noted that, when this BRG is manufactured, the micro vibration body may be joined in a state where a mounted portion of the micro vibration body is tilted with respect to the mounting surface of the mounting substrate and is tilted with respect to the mounting substrate. In this case, in the micro vibration body, the areas of portions of the rim, which are faced to the plurality of electrode portions, respectively, may differ depending on the position. As a result, in the BRG, the capacitance of the capacitor, which is formed between the BR and each of the plurality of electrode portions, varies, and the sensor accuracy may be decreased.

According to an example of the present disclosure, an inertial sensor is provided, in which a micro vibration body that vibrates in a wine glass mode is mounted on a mounting substrate. The inertial sensor may be configured to suppress a variation in an area of a rim of the micro vibration body, which faces each of a plurality of electrodes on the mounting substrate, and to improve a sensor accuracy.

According to an example of the present disclosure, an inertial sensor comprises a micro vibration body that is a thin-walled member having a front surface, which is a surface on a side having a large outer diameter, and a back surface, which is an opposite surface to the front surface. The micro vibration body includes a curved surface portion, which has an annular curved surface, and a recessed portion, which is recessed from the curved surface portion to a side of the back surface. The inertial sensor further comprises a mounting substrate that includes a lower substrate and an upper substrate, which are joined to each other. The upper substrate includes an inner frame portion, which has a frame-shape, and a plurality of electrode portions, which are separated from each other and surround an inner frame portion. The inertial sensor further comprises a joining member that is provided in an inner region of the mounting substrate, which is surrounded by the inner frame portion.

The recessed portion of the micro vibration body has a bottom surface defining a mounted surface on a side of the back surface. The mounted surface is located in the inner region and is joined to the mounting substrate via the joining member. The curved surface portion has a rim that is in a hollow state. The rim is a part of the curved surface portion and includes an end portion of the curved surface portion on an opposite side to the recessed portion. The rim has a rim lower surface, which is a surface connecting the front surface with the back surface. The rim lower surface is located on a same plane as the mounted surface or a tip end portion of the mounted surface.

According to this inertial sensor, the micro vibration body, which has the curved surface portion having the three-dimensional curved surface and the recessed portion recessed from the curved surface portion, is joined to the mounting substrate. The curved surface portion has the rim that is in a hollow state. The rim is a part of the curved surface portion and includes an end portion of the curved surface portion on an opposite side to the recessed portion. In this inertial sensor, the mounted surface of the recessed portion, at which the minute vibrating body is joined to the mounting substrate, or the tip end portion and the rim lower surface of the rim connecting the front surface with the back surface are located on the same plane. That is, the mounted surface and the rim bottom surface are located at the same height. Therefore, even when the micro vibration body is tilted with respect to the mounting substrate, a variation in the position of the rim with respect to the plurality of electrode portions in the height direction, that is, a variation in the areas of the rim faced to the plurality of electrode portions is reduced. Therefore, this inertial sensor is configured to enable to reduce, even when the micro vibration body is tilted with respect to the mounting substrate, a variation in a capacitance of a capacitor composed of the micro vibration body and the plurality of electrode portions of the mounting substrate and to enhance a sensor accuracy.

According to an example of the present disclosure, a method is for manufacturing an inertial sensor.

The inertial sensor includes a micro vibration body that is a thin-walled member having a front surface, which is a surface on a side having a large outer diameter, and a back surface, which is an opposite surface to the front surface, the micro vibration body including a curved surface portion, which has an annular curved surface, and a recessed portion, which is recessed from the curved surface portion to a side of the back surface. The inertial sensor further includes a mounting substrate that includes a lower substrate and an upper substrate, which are joined to each other, the upper substrate including an inner frame portion, which has a frame-shape, and a plurality of electrode portions, which are separated from each other and surround the inner frame portion, the micro vibration body and the mounting substrate being joined with each other via a joining member. The method comprises preparing the micro vibration body.

The method further comprises providing the joining member in an inner region surrounded by the inner frame portion in the mounting substrate. The method further comprises positioning the recessed portion of the micro vibration body in the inner region and bringing a mounted surface, which is a bottom surface of the recessed portion on a side of the back surface, into contact with the joining member, after providing the joining member. The method further comprises melting the joining member and subsequently solidifying the joining member to join the micro vibration body with the mounting substrate and to cause a rim, which is an end portion of the curved surface portion of the micro vibration body on an opposite side to the recessed portion, to be in a hollow state. The preparing the micro vibration body includes heating and melting a thin-walled base material of micrometer order and solidifying the thin-walled base material to form a curved surface part, which is to be the curved surface portion, and a recessed part, which is to be the recessed portion, and thereafter sealing the thin-walled base material with a sealing material. The preparing the micro vibration body further includes removing a part of the curved surface part, the recessed part, and the sealing material by polishing to form a rim lower surface, which connects the front surface with the back surface, such that the rim lower surface and the mounted surface are located on a same plane.

This method for manufacturing the inertial sensor includes heating and melting the thin-walled base material and solidifying the thin-walled base material to form the curved surface part and the recessed part, and subsequently polishing the curved surface part and the recessed part to form the micro vibration body having the mounted surface and the lower surface of the rim that are located in the same plane, i. e., that are coplanar. The mounted surface and the rim lower surface of the micro-vibration body are located on the same plane. Therefore, even when the micro vibration body is tilted in the process in which the micro vibration body is joined to the mounting substrate, the variation in the areas of the rim arranged to face the plurality of electrodes of the mounting substrate is reduced. Therefore, the method enables to manufacture the inertial sensor configured to reduce the variation in the capacitance of the capacitor composed of the micro vibration body and the plurality of electrode portions of the mounting substrate and to enhance a sensor accuracy.

According to an example of the present disclosure, a method is for manufacturing an inertial sensor. The inertial sensor includes a micro vibration body that is a thin-walled member having a front surface, which is a surface on a side having a large outer diameter, and a back surface, which is an opposite surface to the front surface, the micro vibration body including a curved surface portion, which has an annular curved surface, a recessed portion, which is recessed from the curved surface portion to a side of the back surface, and a through hole, which is formed in a mounted surface defining a bottom surface of the recessed portion. The inertial sensor further includes a mounting substrate that includes a lower substrate and an upper substrate, which are joined to each other, the upper substrate including an inner frame portion, which has a frame-shape, a plurality of electrode portions, which are separated from each other and surround the inner frame portion, and a column portion, which is provided in a region surrounded by the inner frame portion, the micro vibration body and the mounting substrate being joined with each other via a joining member.

The method comprises preparing the micro vibration body. The method further comprises inserting the column portion of the mounting substrate into the through hole of the micro vibration body to mount the micro vibration body on the mounting substrate. The method comprises pouring the joining member into the recessed portion and solidifying the joining member to join the micro vibration body with the mounting substrate and to cause a rim, which is an end portion of the curved surface portion of the micro vibration body on an opposite side to the recessed portion, to be in a hollow state, after mounting the micro vibration body on the mounting substrate.

The preparing the micro vibration body includes heating and melting a thin-walled base material of micrometer order and solidifying the thin-walled base material to form a curved surface part, which is to be the curved surface portion, and a recessed part, which is to be the recessed portion, and thereafter sealing the thin-walled base material with a sealing material. The preparing the micro vibration body further includes removing a part of the curved surface part, the recessed part, and the sealing material by polishing to form a rim lower surface, which connects the front surface with the back surface, such that the rim lower surface and the mounted surface are located on a same plane.

This method includes, in addition to locating the mounted surface and the rim lower surface on the same plane similarly to the method for manufacturing the inertial sensor according to the second aspect of the present disclosure, forming the micro vibration body having the through hole in the mounted surface. On the other hand, the method requires preparing the mounting substrate having the column portion to be inserted into the through hole formed in the mounted surface of the micro vibration body. Furthermore, the method requires inserting the support column of the mounting substrate into the through hole of the micro vibration body and mounting the micro vibration body on the mounting substrate, and subsequently, pouring the joining member into the recessed portion of the micro-vibration body and solidifying the joining member. In this way, the micro-vibration body and the mounting substrate are joined. Even after implementing the joining process, the mounted surface and the rim lower surface are located on the same plane. Therefore, the method enables to manufacture the inertial sensor configured to reduce the variation in the capacitance of the capacitor composed of the micro vibration body and the plurality of electrode portions of the mounting substrate and to enhance a sensor accuracy.

Embodiments of the present disclosure will be described below with reference to the drawings. In the following embodiments, the same reference numerals are assigned to parts that are the same or equivalent to each other for description.

First Embodiment

An inertial sensor 1 according to an embodiment will be described with reference to FIGS. 1 to 9.

Figure 2:
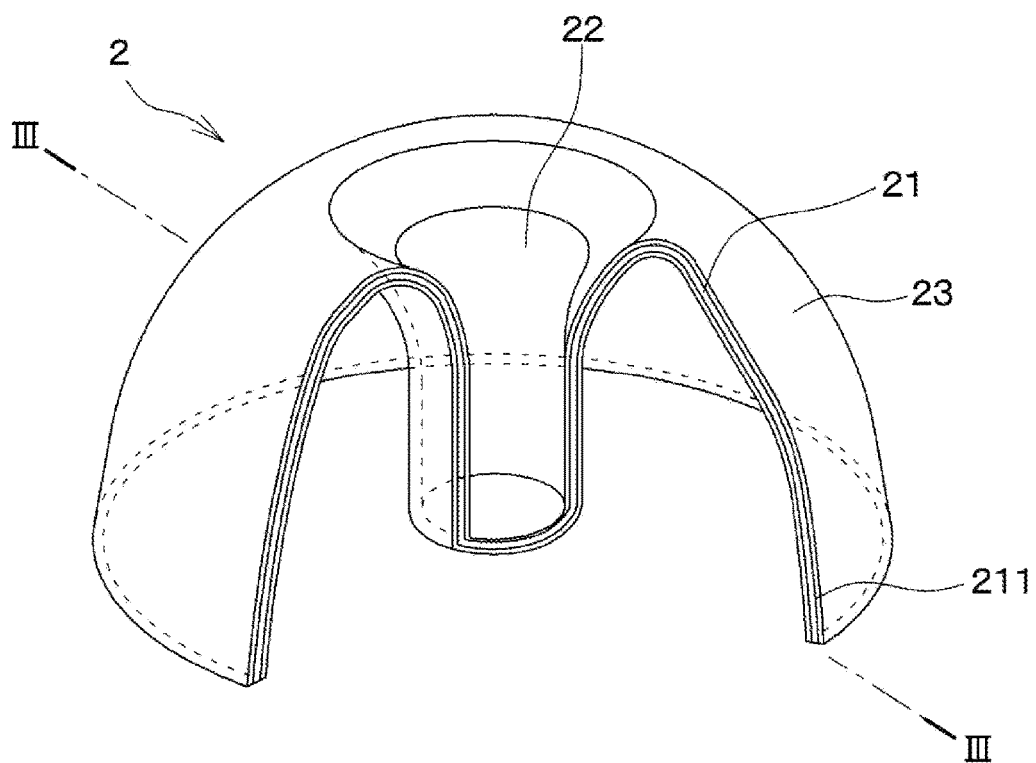
FIG. 2 is a perspective view showing a micro vibration body for the inertial sensor.

In FIG. 2, in order to facilitate understanding of the configuration of a micro vibration body 2 to be described later, the cross section of the micro vibration body 2 is shown by omitting a part of the micro vibration body 2, and a portion of an outer shell of the micro vibration body 2 that cannot be seen from the angle shown in FIG. 2 is shown by a broken line.

Hereinafter, for convenience of explanation, as shown in FIG. 1, the direction along the left-right direction in the view is referred to as a "x direction", the direction orthogonal to the x direction in the view is referred to as a "y direction", and the normal direction to the x-y plane is referred to as a "z direction". The x, y, and z directions in the views in FIG. 3 and subsequent drawings correspond to the x, y, and z directions in FIG. 1, respectively. Further, in the present specification, "upper" represents a direction along the z direction in the view and represents a direction along the arrow, and "lower" represents the opposite direction to the upper. Further, in the present specification, for example, as shown in FIG. 1, a state in which the inertial sensor 1 or a mounting substrate 3 is viewed from the upper side in the z direction may be referred to as "top view".

(Fundamental Configuration)

As shown in FIG. 1, the inertial sensor 1 includes, for example, the micro vibration body 2 and the mounting substrate 3. A part of the micro vibration body 2 is joined to the mounting substrate 3. The inertial sensor 1 is configured to detect an angular velocity applied to the inertial sensor 1 based on a change in capacitance between the micro vibration body 2, which is thin-walled and configured to vibrate in a wine glass mode, and a plurality of electrode portions 53 of the mounting substrate 3 which will be described later. The inertial sensor 1 is, for example, a gyro sensor having a BRG structure, and may be suitable for applications to be mounted on vehicles such as automobiles, nevertheless, the device may also be applied to other applications.

As shown in FIGS. 1 and 2, the micro vibration body 2 includes, for example, a curved surface portion 21 having an outer shape of a substantially hemispherical three-dimensional curved surface, and a recessed portion 22 recessed from an apex side of the curved surface portion 21 of the substantially hemispherical shape toward the center side of the substantially hemispherical shape. The micro vibration body 2 includes a rim 211, which is an end portion of the curved surface portion 21 opposite to the recessed portion 22. The rim 211 has a substantially cylindrical shape. In the micro vibration body 2, for example, the curved surface portion 21 has a bowl-shaped three-dimensional curved surface. The micro vibration body 2 exhibits a Q factor of vibration that is $10^6$ or more. The end of the curved surface portion 21 opposite to the recessed portion 22 is the rim 211. The micro vibration body 2 is mounted on the mounting substrate 3, such that a front surface 2a of the rim 211 faces the plurality of electrode portions 53 of the mounting substrate 3, which will be described later, and such that the plurality of electrode portions 53 are evenly spaced therebetween.

Figure 3:
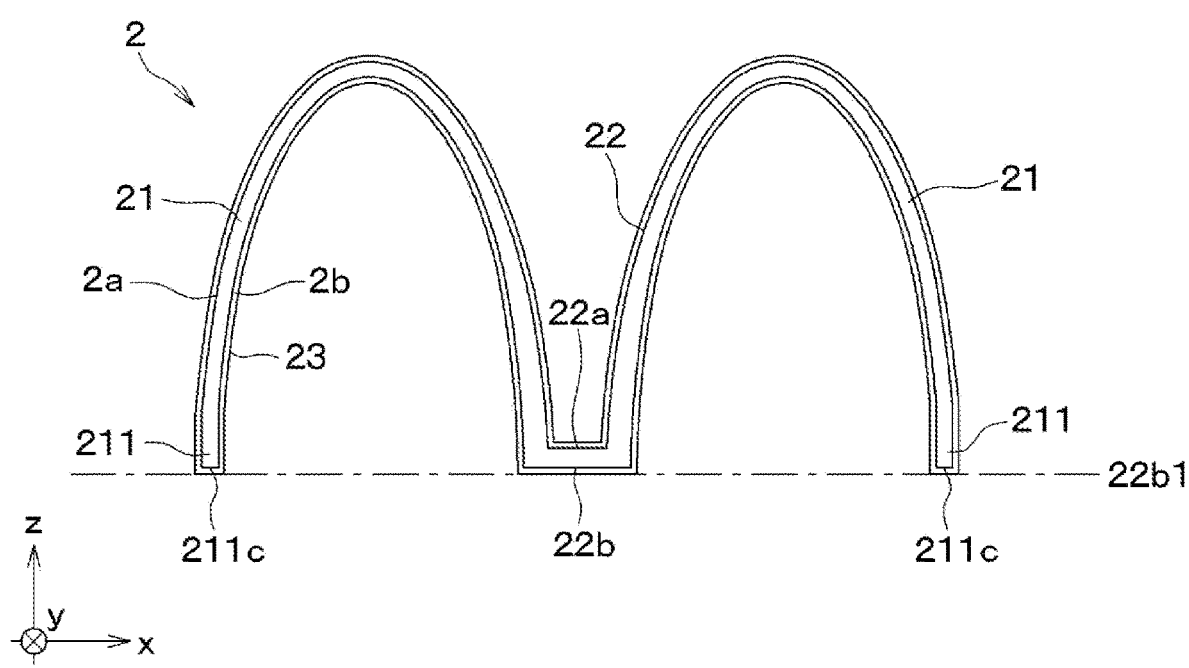
FIG. 3 is a cross-sectional view showing a configuration of a cross-section taken along a line III-III in FIG. 2.

For example, as shown in FIG. 3, the micro vibration body 2 has a surface having the larger outer diameter, which is a front surface 2a, and the opposite surface, which is a back surface 2b. A bottom surface of the recessed portion 22, which is on the side of the back surface 2b in the Z direction, is a mounted surface 22b joined to the mounting substrate 3. For example, a bottom surface of the recessed portion 22 of the micro vibration body 2 on the side of the front surface 2a in the Z direction is a suction surface 22a, which is used for conveying the micro vibration body 2 when the micro vibration body 2 is mounted on the mounting substrate 3. The curved surface portion 21 including the rim 211 is in a hollow state so as not to come into contact with other components and is configured such that the hollow rim 211 vibrates in the wine glass mode, when the micro vibration body 2 is mounted on the mounting substrate 3.

For example, as shown in FIG. 3, the micro vibration body 2 has a shape such that the rim 211 has a rim lower surface 211c, which is a surface connecting the front surface 2a with the back surface 2b, and such that the rim lower surface 211c and the mounted surface 22b form a same virtual plane 22b1. This is a result of simultaneously forming the rim lower surface 211c and the mounted surface 22b by polishing and CMP in a process of forming the micro vibration body 2 described later. The micro vibration body 2 has a shape such that the rim lower surface 211c and the mounted surface 22b are located on the same plane. Therefore, when the micro vibration body 2 is mounted on the mounting substrate 3, a variation in the position of the rim 211 with respect to the plurality of electrode portions 53 of the mounting substrate 3 in the height direction is reduced. In other words, the micro vibration body 2 has a shape that reduces a variation in the areas of the rim 211 that face the plurality of electrode portions 53 respectively when mounted on the mounting substrate 3. In the micro vibration body 2, for example, the entirety of the front surface 2a and the entirety of the back surface 2b are covered with a conductive layer 23.

The conductive layer 23 is formed of, for example, but not limited to, a laminated film of a conductive material such as Cr (chromium) or Ti (titanium) and Au (gold) or Pt (platinum) from the side of the base material. The conductive layer 23 serves as an electrode film. The conductive layer 23 is formed on the front surface 2a and the back surface 2b of the micro vibration body 2 by an appropriate vacuum film forming method such as sputtering or thin film deposition.

The micro vibration body 2 is made of a material such as quartz, glass, silicon or ceramic. However, the micro vibration body 2 is not limited to be formed of the above-described material. It may be sufficient that the micro vibration body 2 has the curved surface portion 21 having a three-dimensional curved surface shape and the recessed portion 22 and that the micro vibration body 2 is configured to vibrate in the wine glass mode. The micro vibration body 2 is formed by processing a thin-walled base material made of the above-described material by, for example, a forming process described later. As a result, the micro vibration body 2 is formed such that the curved surface portion 21 and the recessed portion 22 have a thickness of 20 μm to 80 μm, which is a thin member on the order of micrometer. The micro vibration body 2 has a shape in a millimeter-size such that, the micro vibration body 2 is 2.5 mm in a height direction and the outer diameter of the micro vibration body 2 on the side of the front surface 2a of the rim 211 is 5 mm, for example. The height direction is along the thickness direction of the mounting substrate 3.

Figure 4A:
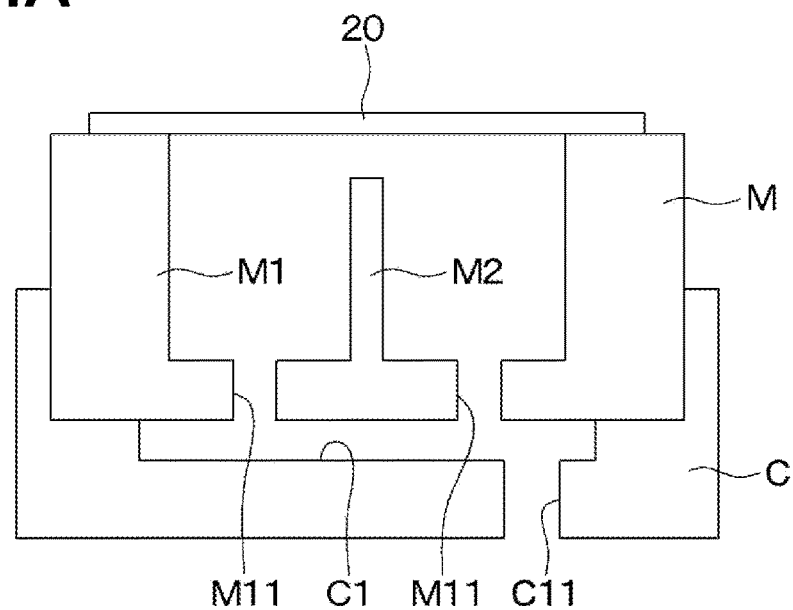
FIG. 4A is a view showing a process for preparing a member for forming the micro vibration body.

The micro vibration body 2 is formed by, for example, the following process. First, for example, as shown in FIG. 4A, a quartz plate 20, a mold M for forming the shape of the three-dimensional curved surface, and a cooling body C for cooling the mold M are prepared. The mold M has, for example, a recessed portion M1, which forms a space for forming the shape of the three-dimensional curved surface on the quartz plate 20, and a support portion M2, which is in a column shape and is at the center of the recessed portion M1 and extends along a depth direction of the recessed portion M1 and supports a part of the quartz plate 20 during the process. The mold M has through holes M11 formed in the bottom surface of the recessed portion M1 and are attached to a cooling body C so that the through holes M11 communicate with the cooling body C. The cooling body C has a fitting portion C1, into which the mold M is fitted, and an exhaust port C11, which is formed on the bottom of the fitting portion C1 and is used for exhaust. The cooling body C is configured to cool the mold M when the quartz plate 20 is processed. The quartz plate 20 is arranged so as to cover an entire area of the recessed portion M1 of the mold M.

Figure 4B:
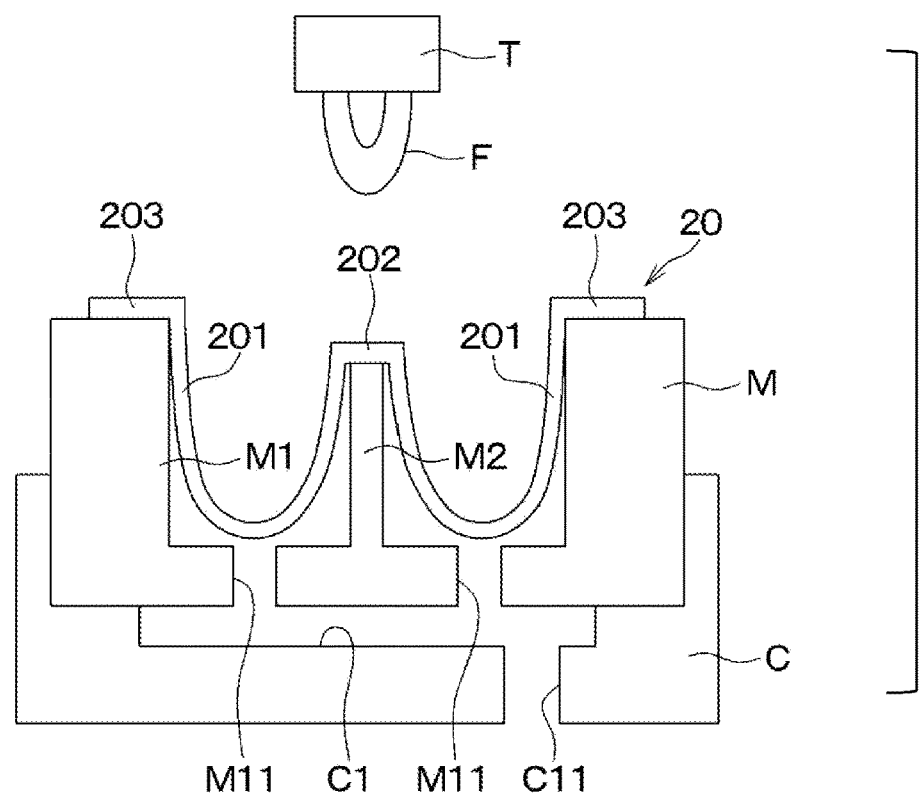
FIG. 4B is a view showing a process following the process of FIG. 4A.

Then, for example, as shown in FIG. 4B, a flame F is applied from a torch T toward the quartz plate 20 to heat the quartz plate 20 to melt the quartz plate 20. At this time, the recessed portion M1 of the mold M is evacuated through the exhaust port C11 of the cooling body C by a vacuum mechanism (not shown). As a result, the melted portion of the quartz plate 20 is stretched toward the bottom surface of the recessed portion M1. In addition, a central peripheral region of the melted portion of the quartz plate 20 is supported by the support portion M2. After that, the heating of the quartz plate 20 is stopped, and the quartz plate 20 is cooled. Thus, the quartz plate 20 is formed with a curved surface part 201, which has a substantially hemispherical three-dimensional curved surface shape, and a recessed part 202 in the vicinity of the center of the curved surface part 201 by being supported by the support portion M2. Further, a portion of the quartz plate 20, which is located on the outside of the recessed portion M1, becomes a tip end portion 203, which is located at the outer peripheral edge of the curved surface part 201 and has a flat shape.

Figure 4C:
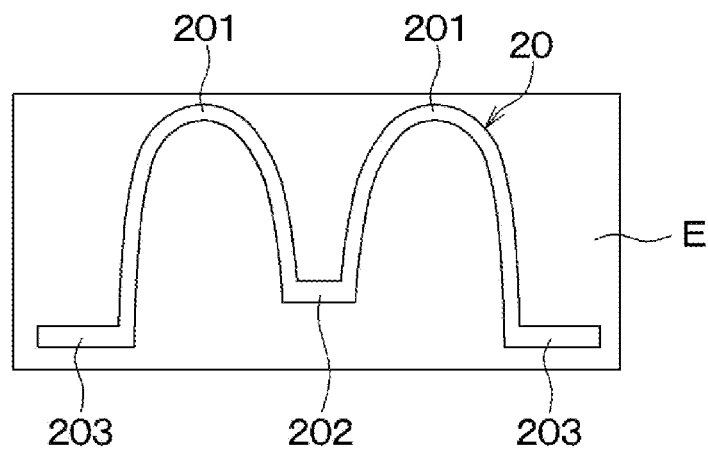
FIG. 4C is a view showing a process following the process of FIG. 4B.
Figure 4D:
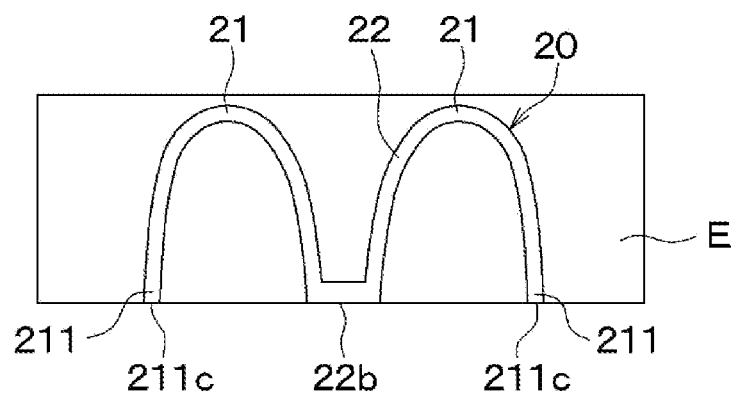
FIG. 4D is a view showing a process following the process of FIG. 4C.

Subsequently, the recessed portion M1 of the mold M is returned to be in a state of normal pressure, and the processed quartz plate 20 is removed. As shown in FIG. 4C, the quartz plate 20 is sealed with, for example, a sealing material E, which is made of a curable resin material. Then, as shown in FIG. 4D, the sealing material E is, for example, polished and is applied with CMP (Chemical Mechanical Polishing) from the surface close to the side of the tip end portion 203. In this way, the sealing material E together with the tip end portion 203 and the tip end of the recessed part 202 are removed.

As a result, the quartz plate 20 has the curved surface portion 21 having an annular curved surface and the recessed portion 22 recessed from the curved surface portion 21. The rim lower surface 211c and the mounted surface 22b are located on the same plane.

Then, all the sealing material E is removed by a method such as heating or melting using a chemical solution, and the quartz plate 20 is taken out. Finally, the conductive layer 23 is formed on the front surface and the back surface of the quartz plate 20 after the above process, by, for example, a film formation process such as sputtering, vapor deposition, atomic layer deposition (ALD) or chemical vapor deposition (CVD).

The micro vibration body 2 is manufactured by, for example, the above-described manufacturing process, and has a substantially half-toroidal shape that is rotationally symmetric with the Z direction as the axis of rotation. It is noted that, the molding of the base material is not limited to the above method, and another method may be adopted. Further, the micro vibration body 2 may have a shape that is configured to vibrate in the wine glass mode, and is not limited to the shape of the BR.

Figure 5:
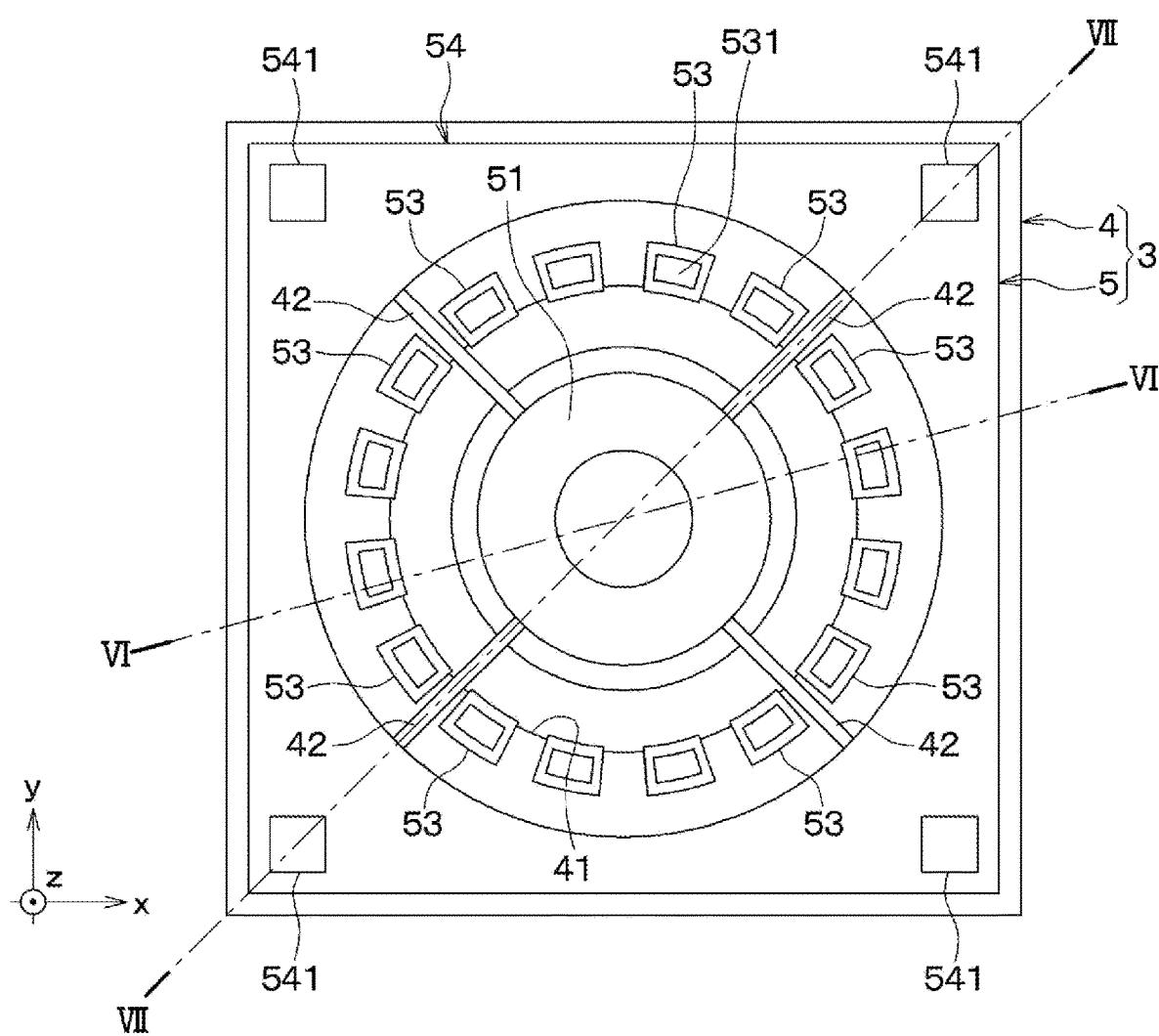
FIG. 5 is a top view showing a mounting substrate on which the micro vibration body of FIG. 2 is mounted.

As shown in FIG. 5, for example, the mounting substrate 3 includes a lower substrate 4 and an upper substrate 5, which are joined to each other. For example, the mounting substrate 3 is formed by anodic bonding the upper substrate 5, which is formed of a semiconductor material Si (silicon), to the lower substrate 4, which is formed of borosilicate glass, which is an insulating material. The mounting substrate 3 includes an inner frame portion 51, the plurality of electrode portions 53 arranged apart from each other so as to surround the inner frame portion 51, and an outer frame portion 54 arranged so as to surround the electrode portions 53.

Figure 8:
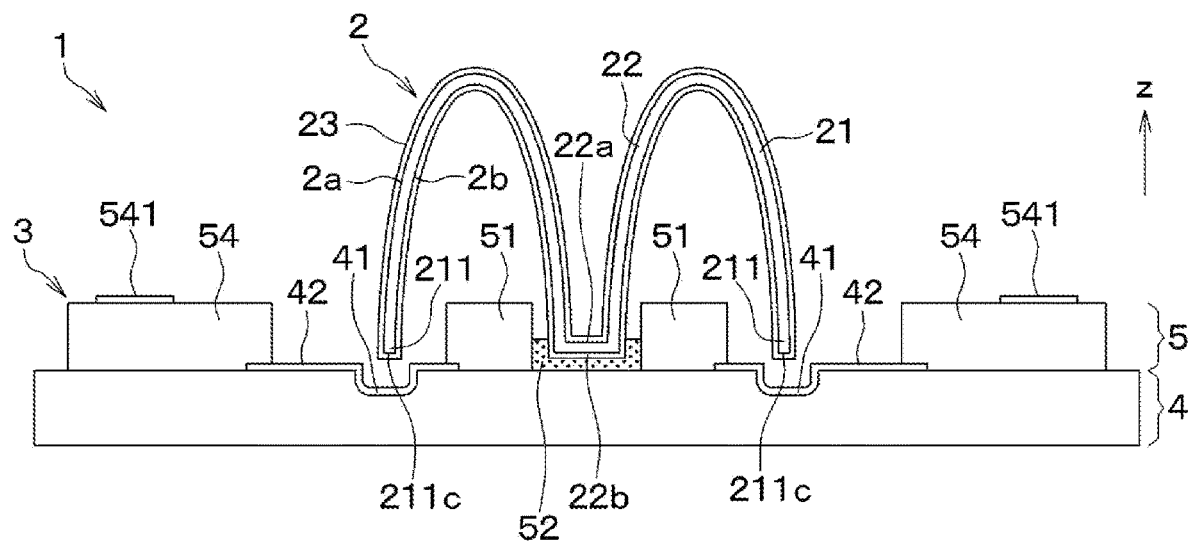
FIG. 8 is a cross-sectional view showing a configuration of a cross-section taken along a line VIII-VIII in FIG. 1.
Figure 9:
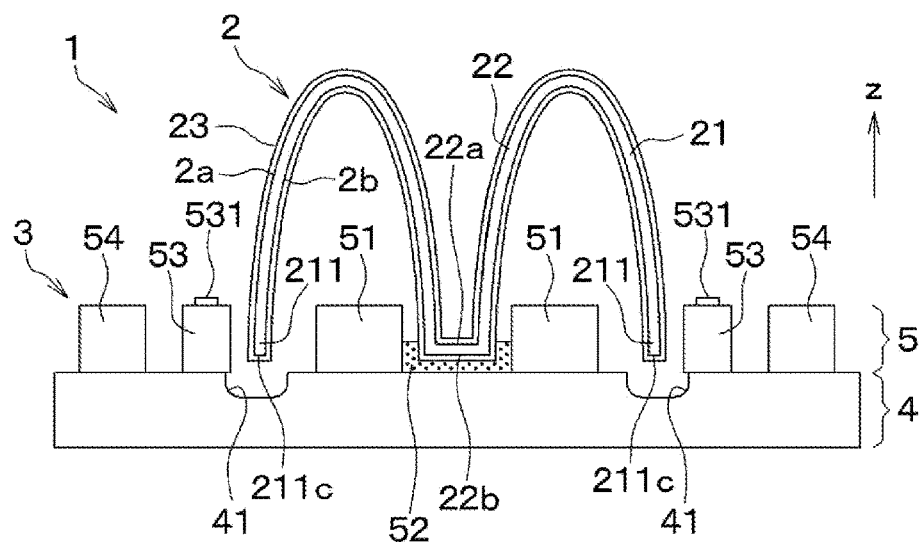
FIG. 9 is a cross-sectional view showing a configuration of a cross-section taken along a line IX-IX in FIG. 1.

The inner frame portion 51 has, in the top view, for example, an annular shape. It may be sufficient that the inner frame portion 51 has a frame shape that surrounds a region of the lower substrate 4 to which the micro vibration body 2 is joined. It is noted that, the shape of the inner frame portion 51 is not limited to the above-described shape. As shown in FIGS. 8 and 9, for example, the inner frame portion 51 has dimensions such that its outer diameter and its inner diameter and do not come into contact with the micro vibration body 2, which has the substantially M-shape in the cross section.

The plurality of electrode portions 53 are arranged apart from each other so as to surround the inner frame portion 51 at the position on the radially outer side of an etching groove 41. As shown in FIG. 5, for example, the plurality of electrode portions 53 have arcuate sides on the inner peripheral side and the outer peripheral side when viewed from the upper side. When the inner peripheral side and the outer peripheral side of the electrode portions 53 are connected to each other, intermittent circles with different diameters are drawn. In other words, the plurality of electrode portions 53 have a configuration such that an annulus surrounding the inner frame portion 51 is evenly divided at predetermined intervals.

Figure 6:
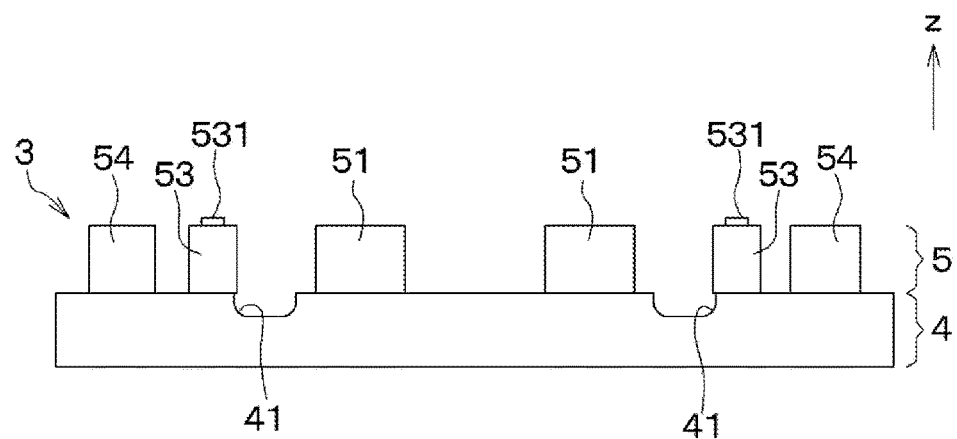
FIG. 6 is a cross-sectional view showing a configuration of a cross-section taken along a line VI-VI in FIG. 5.

As shown in FIG. 6, for example, each of the plurality of electrode portions 53 has an electrode film 531 formed on the upper surface thereof. For example, a wire (not shown) is connected to the electrode film 531, and the plurality of electrode portions 53 are electrically connected to an external circuit board (not shown) to enable control of the potential. As shown in FIGS. 1 and 8, for example, when the micro vibration body 2 is mounted, the plurality of electrode portions 53 are in a state of being separated from the rim 211 of the micro vibration body 2 by a predetermined distance, and each of the plurality of electrode portions 53 forms a capacitor with the micro vibration body 2. That is, the mounting substrate 3 is configured to detect the capacitance with the micro vibration body 2 via the plurality of electrode portions 53 and to generate an electrostatic attractive force with the micro vibration body 2 to enable to vibrate the micro vibration body 2 in the wine glass mode.

In the top view as shown in FIG. 5, the "inner peripheral side" of the mounting substrate 3 means an inner region surrounded by the inner frame portion 51 on the central side, and the "outer peripheral side" of the mounting substrate 3 means the side located opposite to the inner peripheral side. Further, FIG. 1 and the like show an example in which the electrode portions 53 of 16 elements are evenly arranged on the mounting substrate 3 and are separated from each other so as to form a ring, but the present disclosure is not limited to this example. The number and the arrangement of the electrode portions 53 may be appropriately modified according to the shape and the size of the micro vibration body 2.

Figure 7:
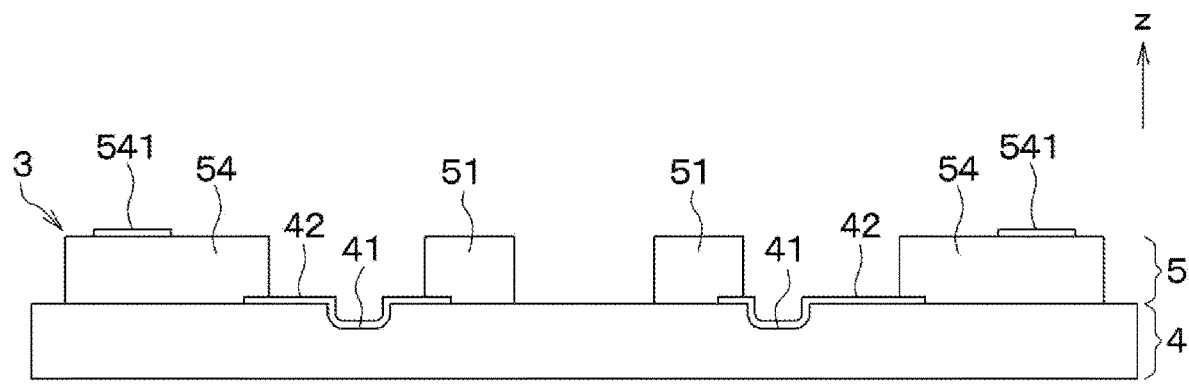
FIG. 7 is a cross-sectional view showing a configuration of a cross-section taken along a line VII-VII in FIG. 5.

The outer frame portion 54 has a single frame shape surrounding the inner frame portion 51 in the top view and is provided with the electrode films 541, which are formed of Al or the like on the upper surface, for example, as shown in FIGS. 5 and 7. A wire (not shown) is connected to the electrode film 541, and the outer frame portion 54 is electrically connected to the external circuit board or the like (not shown). As a result, the potential of the outer frame portion 54 can be controlled by an external power source (not shown) or the like.

In the mounting substrate 3, the annular etching groove 41 surrounding the inner frame portion 51 is formed at a position on the outer peripheral side of the annular-shaped inner frame portion 51 when viewed from the upper side. As a result, when the micro vibration body 2 is mounted on the mounting substrate 3, the curved surface portion 21 including the rim 211 of the micro vibration body 2 becomes hollow, as shown in FIGS. 8 and 9, for example.

For example, as shown in FIG. 5, the mounting substrate 3 includes a bridge wiring 42 that connects the inner frame portion 51 with the outer frame portion 54 while straddling the etching groove 41 of the lower substrate 4 in the top view. The bridge wiring 42 is formed of a conductive material such as Al (aluminum) and is arranged to pass between the plurality of electrode portions 53. The bridge wiring 42 is electrically independent of the plurality of electrode portions 53. As shown in FIG. 7, for example, one end of the bridge wiring 42 is covered with the outer frame portion 54, and the other end of the bridge wiring 42 is covered with the inner frame portion 51. As a result, the bridge wiring 42 electrically connects the inner frame portion 51 with the outer frame portion 54 and renders the inner frame portion 51 with the outer frame portion 54 at the same potential. Further, a joining member 52 is arranged in the inner region of the mounting substrate 3 surrounded by the inner frame portion 51. Further, the micro vibration body 2 is joined with the joining member 52. Therefore, the outer frame portion 54 is electrically connected to the micro vibration body 2 via the bridge wiring 42, the inner frame portion 51, and the joining member 52. In other words, the mounting substrate 3 is configured to adjust the potential of the micro vibration body 2 by adjusting the potential of the outer frame portion 54. The number and the arrangement of the bridge wiring 42 are not limited to the example shown in FIG. 5, and may be changed as appropriate.

The mounting substrate 3 may be manufactured by, for example, the following process.

First, for example, the lower substrate 4 made of borosilicate glass is prepared, and the annular etching groove 41 is formed by wet etching using buffered hydrofluoric acid. After that, the bridge wiring 42 that straddles the etching groove 41 is formed by, for example, a lift-off method using film formation by sputtering Al. The thickness of the bridge wiring 42 is, for example, about 0.1 μm.

Subsequently, for example, a Si substrate made of Si (later the upper substrate 5) is prepared and is an anode-bonded to the lower substrate 4 of the borosilicate glass. Next, grooves for partitioning a region to be the inner frame portion 51, a region to be the plurality of electrode portions 53, and a region to be the outer frame portion 54 are formed on the Si substrate by a known etching method.

Specifically, for example, trench etching is performed by DRIE (Deep Reactive Ion Etching) to expose the lower substrate 4 and to divide the region to be the inner frame portion 51, the region to be the plurality of electrode portions 53, and the region to be the outer frame portion 54 from each other. As a result, the Si substrate becomes the upper substrate 5 including the inner frame portion 51, the plurality of electrode portions 53, and the outer frame portion 54, which are separated from each other. Further, the etching groove 41 formed in the lower substrate 4 is exposed from the upper substrate 5 by the dividing process of the Si substrate.

Finally, for example, the electrode films 531 and 541 are formed on the upper surfaces of the plurality of electrode portions 53 and the outer frame portion 54 by sputtering or the like. As a result of the process, the mounting substrate 3 having the above-described structure can be obtained. Then, when the micro vibration body 2 is mounted on the mounting substrate 3, the joining member 52 is provided in a positioning groove 43 of the lower substrate 4. The joining member 52 is, for example, a paste-like conductive material having a conductive material such as AuSn (gold tin), Ag (silver), Au, or the like, and is applied into an inner region surrounded by the inner frame portion 51.

The single mounting substrate 3 shown in FIG. 5 or the like can be obtained, for example, by forming regions to be a plurality of mounting substrates 3 each having the above structure on a wafer and separating the plurality of mounting substrates 3 into pieces by dicing cut or the like. In other words, the mounting substrate 3 can be manufactured at a wafer level.

Further, the mounting substrate 3 is, for example, in a vacuum environment where the degree of vacuum is less than a predetermined value, a cap member (not shown) is attached so as not to come into contact with the micro vibration body 2, thereby to vacuum-tightly seal the micro vibration body 2.

The above is the basic configuration of the inertial sensor 1. At the time of driving, the inertial sensor 1 causes the micro vibration body 2 to vibrate in the wine glass mode by generating an electrostatic attraction between a part of the plurality of electrode portions 53 and the micro vibration body 2. In the inertial sensor 1, when the Coriolis force is applied from the outside when the micro vibration body 2 is in the vibrating state, the micro vibration body 2 is displaced and the position of a node of the vibration mode changes. The inertial sensor 1 is configured to detect the angular velocity acting on the inertial sensor 1 by detecting the change in the node of the vibration mode according to the capacitance between the micro vibration body 2 and the plurality of electrode portions 53.

In the inertial sensor 1, the micro vibration body 2 having the shape in which the mounted surface 22b and the rim lower surface 211c are located on the same plane is joined to the mounting substrate 3. In this way, the variation is reduced in each of the capacitance formed between the rim 211 and the plurality of electrode portions 53.

Here, the above-described effect due to the shape of the micro vibration body 2 will be described, for example, in comparison with a micro vibration body 6 of the comparative example shown in FIG. 10A.

The micro vibration body 6 of the comparative example has a substantially hemispherical curved surface portion 61, a recess 62 recessed from the apex of the substantially hemisphere of the curved surface portion 61 toward the center thereof, and an electrode film 63 covering the curved surface portion 61 and the recess 62. A rim lower surface 611c of a rim 611, which is lower than a bottom surface 62b of the recess 62, protrudes downward in the z direction beyond the bottom surface 62b of the recess 62. Similarly to the micro vibration body 2 according to the present embodiment, the micro vibration body 6 of the comparative example is formed by, for example, the process shown in FIGS. 4A to 4C, and subsequently, by the process of removing the unnecessary portions before reaching the bottom surface 62b of the recess 62. Therefore, in the micro vibration body 6 of the comparative example, as shown by the alternate long and short dash line, the rim lower surface 611c is located on the same plane and is located on a plane different from the bottom surface 62b of the recess 62.

In the above process of removing the unnecessary portions, when a grinding surface is tilted with respect to the bottom surface 62b of the recess 62, as shown by the micro vibration body 6 in the comparative example, a degree of protrusion of the rim 611 with respect to the bottom surface 62b is different on the left and right in the cross-sectional view. An inertial sensor, in which the micro vibration body 6 of the comparative example is mounted on the mounting substrate 3 and in which the micro vibration body 6 of the comparative example is tilted with respect to the mounting substrate 3 is referred to as "inertial sensor 100 of the comparative example".

Figure 10A:
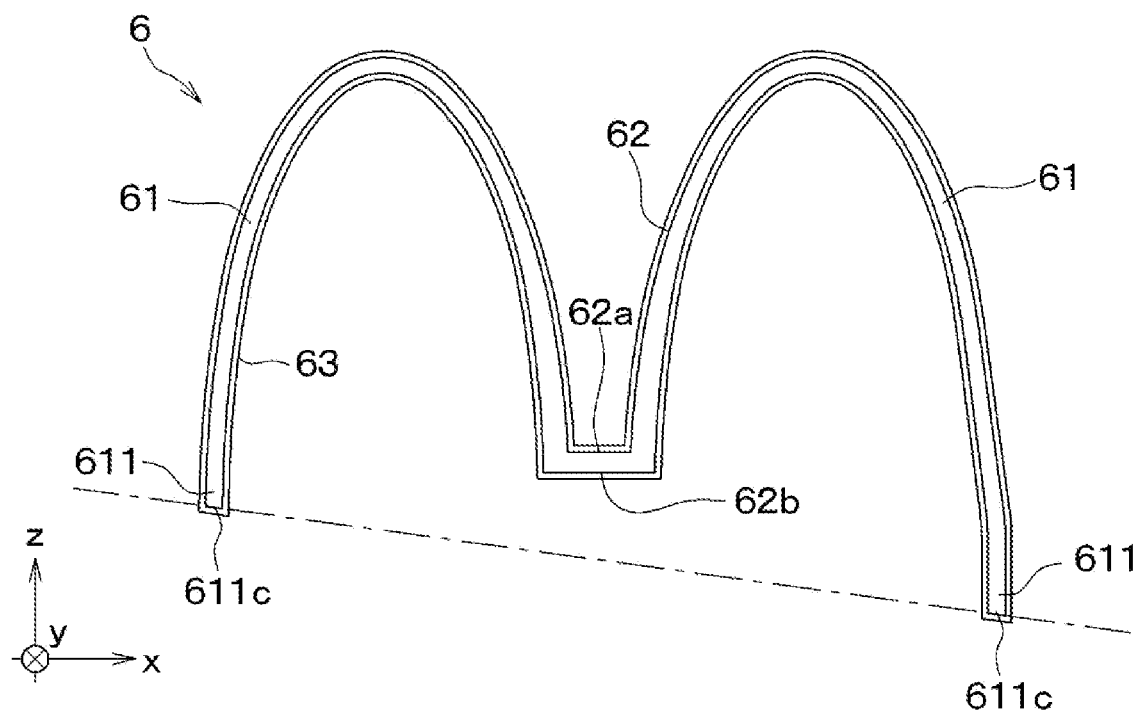
FIG. 10A is a cross-sectional view showing a micro vibration body of a comparative example.
Figure 10B:
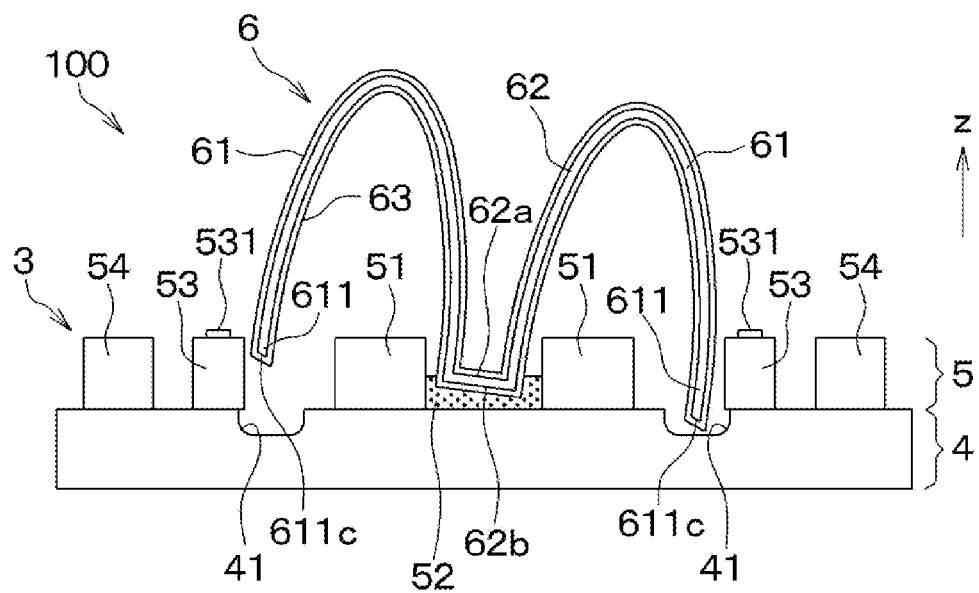
FIG. 10B is a cross-sectional view showing a cross-sectional configuration of an inertial sensor of a comparative example in which the micro vibration body of FIG. 10A is mounted on a mounting substrate.

Specifically, as shown in FIG. 10B, the inertial sensor 100 of the comparative example is, for example, in a state in which the micro vibration body 6 of the comparative example is tilted, and the areas of the rim 611, which face the plurality of electrode portions 53 of the mounting substrate 3, are greatly different from each of the. For example, in the micro vibration body 6 of the comparative example, a distribution arises in the height position of the rim lower surface 611c in the z direction. In addition, a portion of the rim 611 faces only a part of a side surface of the electrode portion 53 along the z direction, and another portion of the rim 611 faces an entirely of the side surface of the electrode portion 53 along the z direction. In this case, the capacitance of one electrode portion 53, in which the entirety of the side faces the rim 611 and the electrode film 63 covering the rim 611, becomes greater as compared to the capacitance of another electrode portion 53, in which only a part of the side faces the rim 611 and the electrode film 63 covering the rim 611. That is, the inertial sensor 100 of the comparative example has a configuration in which the capacitance varies greatly among the plurality of electrode portions 53. Consequently, the sensor accuracy is lowered.

On the other hand, the inertial sensor 1 of the present embodiment is configured by using the micro vibration body 2 in which the mounted surface 22b and the rim lower surface 211c are located on the same plane. Therefore, even when the micro vibration body 2 is tilted, the variation in the area of the rim 211 arranged to face the electrode portion 53 is reduced. As a result, the inertial sensor 1 produces an effect of reducing the variation in the capacitances of the capacitors composed of the rim 211 and the plurality of electrode portions 53 and an effect of improving the sensor accuracy as compared with the inertial sensor 100 of the comparative example.

FIG. 10A is a cross-sectional view showing a cross section corresponding to FIG. 3. FIG. 10B is a cross section showing a cross section corresponding to FIG. 9.

[Manufacturing Method of Inertial Sensor]

Next, the manufacturing method of the inertial sensor 1 of the present embodiment will be described with reference to FIGS. 11A to 11E. Since the manufacturing of the micro vibration body 2 and the mounting substrate 3 has been described above, the process of joining the micro vibration body 2 to the mounting substrate 3 will be mainly described here.

FIGS. 11A to 11E correspond to the cross-sectional view shown in FIG. 9. Further, in FIGS. 11C to 11E, for easy viewing, only a part of a pickup mechanism 300, which will be described later, is briefly shown, and the inside of a collet 302 is shown by a broken line. Further, in FIGS. 11D and 11E, the moving direction of the pickup mechanism 300 is indicated by a white arrow in order to facilitate understanding.

Figure 11A:
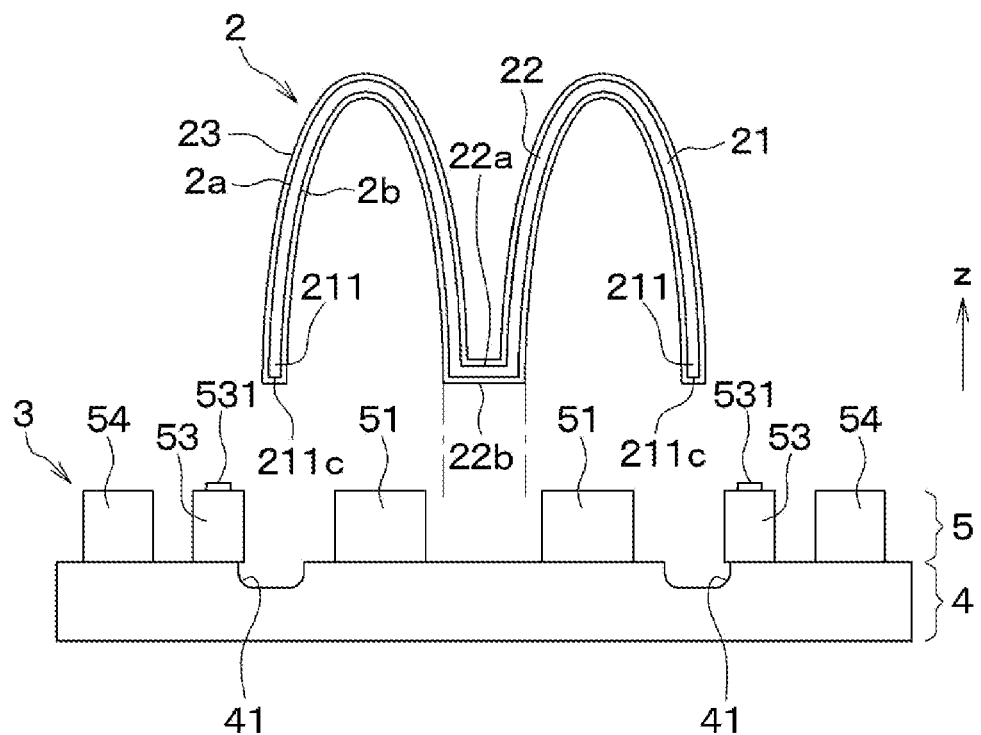
FIG. 11A is a view showing a mounting process of the micro vibration body in the manufacturing of the inertial sensor and is a view showing a process of preparing components.
Figure 11B:
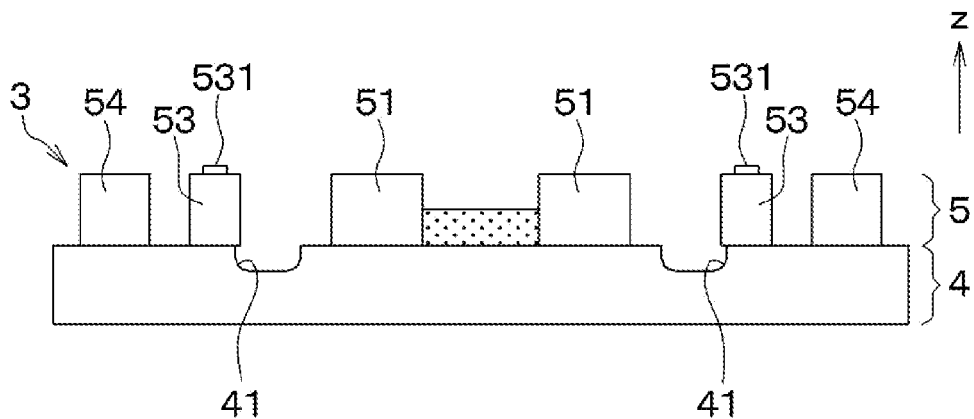
FIG. 11B is a view showing a process following the process of FIG. 11A.

First, as shown in FIG. 11A, for example, the micro vibration body 2 and the mounting substrate 3 manufactured by the above method are prepared. Then, for example, as shown in FIG. 11B, the joining member 52 is provided in the inner region surrounded by the inner frame portion 51. As the joining member 52, for example, a conductive joining material such as Au paste or Ag paste is used, and the joining member 52 is provided by coating with a syringe or the like.

Then, for example, the mounting substrate 3 is placed on a suction surface of a mounter device (not shown), and the mounting substrate 3 is fixed by vacuum suction. The mounter device (not shown) is provided with a heating mechanism configured to heat the suction surface.

Figure 11C:
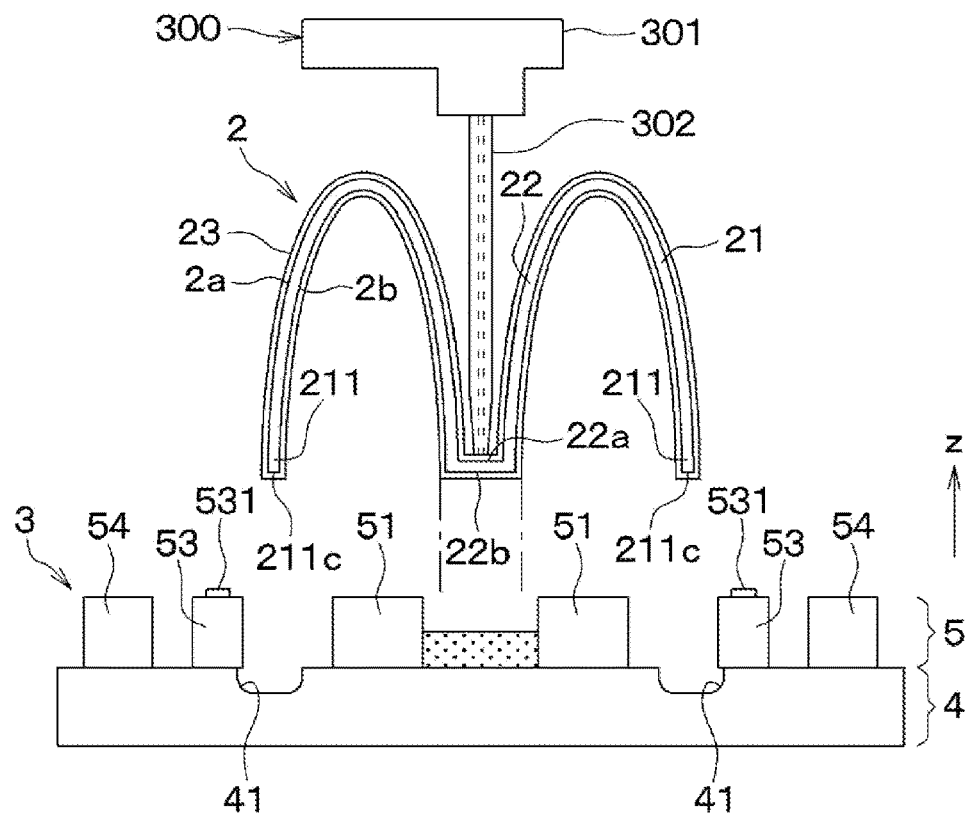
FIG. 11C is a view showing a process following the process of FIG. 11B.

Subsequently, for example, as shown in FIG. 11C, a part of the pickup mechanism 300 is inserted into the suction surface 22a of the recessed portion 22 of the micro vibration body 2 on the side of the front surface 2a, and the micro vibration body 2 is gripped by vacuum suction. The suction surface 22a of the recessed portion 22 of the micro vibration body 2 is a suction surface. The pickup mechanism 300 includes, for example, a pedestal portion 301 and the collet 302 having a substantially cylindrical shape. The pedestal portion 301 is connected to a convey portion and a vacuum mechanism (not shown). The pickup mechanism 300 is configured to perform the vacuum suction by the collet 302 and conveying of the sucked object. In the pickup mechanism 300, for example, the maximum diameter of the collet 302 is smaller than the inner diameter of the recessed portion 22, and the outer diameter of the tip end portion of the collet 302 is smaller than the other portions. Further, in the pickup mechanism 300, the length of the collet 302 is larger than the depth of the recessed portion 22 of the micro vibration body 2. When the collet 302 is inserted into the recessed portion 22 of the micro vibration body 2, the collet 302 is configured not come into contact with a portion of the micro vibration body 2 other than the suction surface 22a of the micro vibration body 2. As a result, this configuration enables to prevent the conductive layer 23 and the base material of the micro vibration body 2 from being scratched when the micro vibration body 2 is conveyed.

Figure 11D:
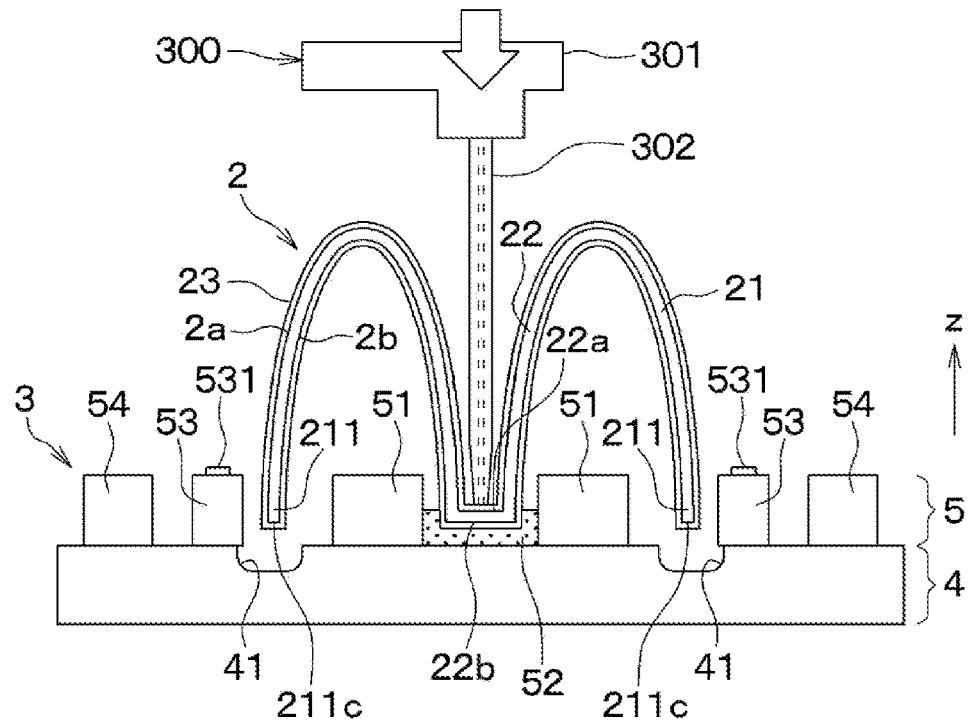
FIG. 11D is a view showing a process following the process of FIG. 11C.

On the other hand, the mounting substrate 3 is heated in a state of being sucked by a mounter device (not shown) to melt or soften the joining member 52. Then, for example, as shown in FIG. 11D, the mounted surface 22b of the recessed portion 22 of the micro vibration body 2 is inserted inside the inner frame portion 51 of the mounting substrate 3, while the suction surface 22a of the micro vibration body 2 is gripped by vacuum suction using the pickup mechanism 300 described above. Subsequently, the micro vibration body 2 is brought closer toward the mounting substrate 3, and the mounted surface 22b of the micro vibration body 2 is brought into contact with the joining member 52.

The alignment of the micro vibration body 2 with respect to the mounting substrate 3 may be made such that the micro vibration body 2 and the mounting substrate 3 are imaged, and feature points are extracted by edge detection by a known image processing technique, thereby to adjust the relative position.

Figure 11E:
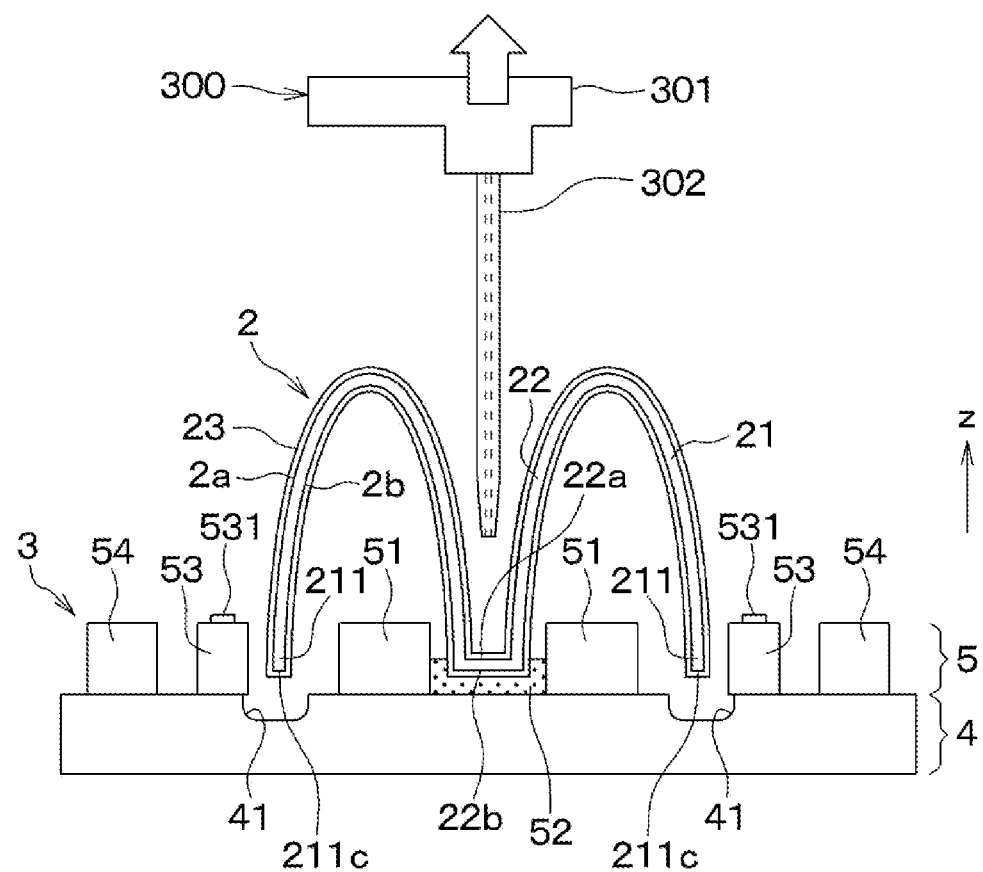
FIG. 11E is a view showing a process following the process of FIG. 11D.

After that, the temperature of the suction surface of the mounter device (not shown) is lowered, and the molten joining member 52 is solidified to join the micro vibration body 2 with the mounting substrate 3. Then, for example, as shown in FIG. 11E, the inside of the collet 302 is returned to normal pressure to release the vacuum suction of the micro vibration body 2, the pickup mechanism 300 is retracted, and the collet 302 is pulled out from the recessed portion 22 of the micro vibration body 2.

Subsequently, the suction by the mounter device or the like (not shown) is released, and the mounting substrate 3 to which the micro vibration body 2 is joined is removed from the suction surface. Then, the mounting substrate 3 is mounted on a circuit board or the like (not shown), and wire bonding is performed to the electrode films 531 and 541 of the mounting substrate 3. In this way, the circuit board and the like, the electrode portion 53, and the outer frame portion 54 of the mounting substrate 3 are electrically connected to each other. Finally, for example, a cap member (not shown) is attached to the mounting substrate 3 or to an external member to which the mounting substrate 3 is mounted in a vacuum environment, and the micro vibration body 2 is sealed tightly in an internal space which is formed by the mounting substrate 3 and the cap member (not shown). By such a process, the inertial sensor 1 according to the embodiment can be manufactured.

The above is the basic manufacturing method of the inertial sensor 1 of the present embodiment. Here, as a method of gripping the micro vibration body 2, the case where the suction surface 22a of the recessed portion 22 is vacuum-sucked has been described as a typical example, but the method is not limited to this example. For example, the configuration of the collet 302 may be changed such that the side wall of the recessed portion 22 on the side of the front surface 2a may be gripped by vacuum suction, or the side wall may be gripped by mechanically pressing the side wall at two or more places.

According to this embodiment, the micro vibration body 2 includes the curved surface portion 21 and the recessed portion 22 and is configured to vibrate in the wine glass mode. The mounted surface 22b of the recessed portion 22 on the side of the back surface 2b and the rim lower surface 611c of the rim 611 are located on the same plane. The micro vibration body 2 is mounted to the mounting substrate 3, and the inertial sensor 1 is manufactured. The mounted surface 22b and the rim lower surface 611c are located on the same plane, thereby to enable to reduce the variation in the areas of the rim 211 arranged to face the plurality of electrode portions 53, respectively, even when the micro vibration body 2 is tilted with respect to the mounting substrate 3. Therefore, this inertial sensor 1 enables to suppress variation in the capacitances of the capacitors composed of the rim 211 and the plurality of electrode portions 53, and to produce an effect of improving the sensor accuracy.

Modification of First Embodiment

In the first embodiment, an example has been described, in which the suction surface 22a and the mounted surface 22b are parallel to each other, and in which the micro vibration body 2 having the shape in which the mounted surface 22b and the rim lower surface 211c are located on the same plane is used. The first embodiment is not limited to this.

Figure 12:
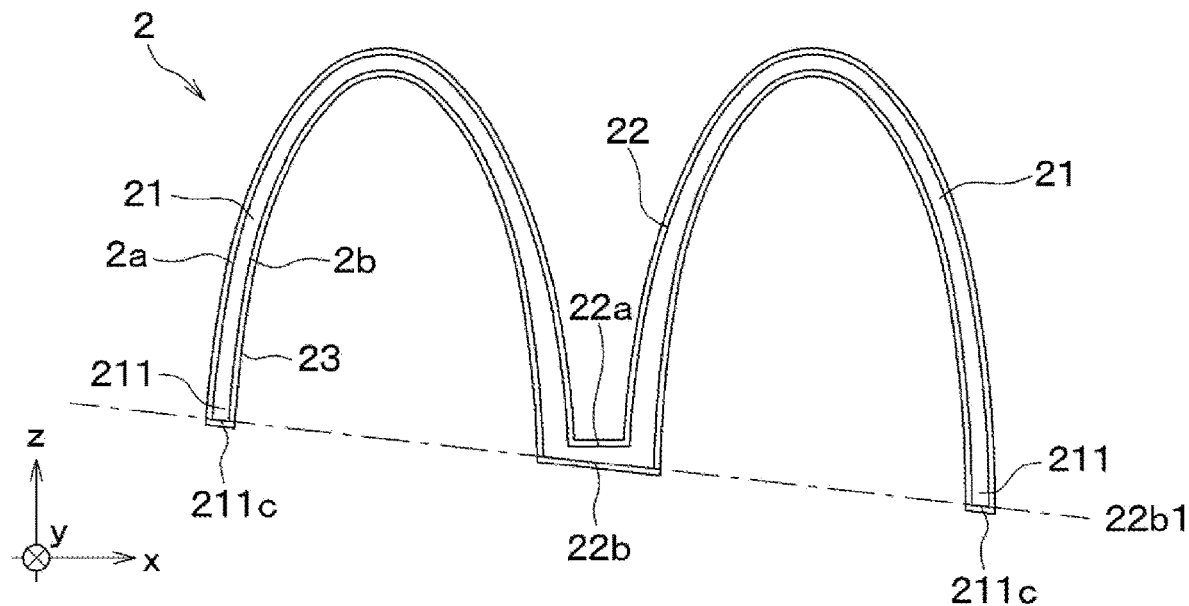
FIG. 12 is a cross-sectional view showing a modified example of the micro vibration body of the inertial sensor according to the first embodiment.
Figure 13:
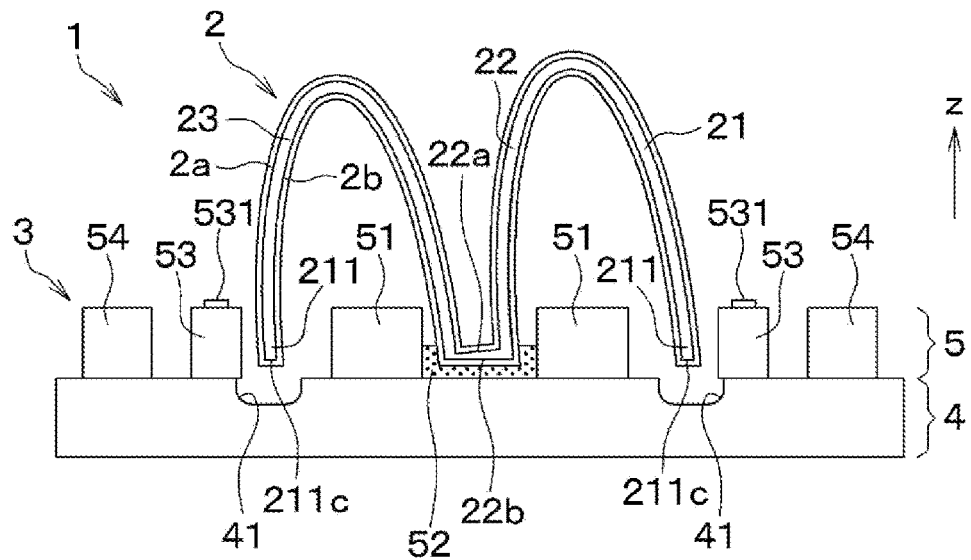
FIG. 13 is a cross-sectional view showing a modified example of the inertial sensor of the first embodiment.

For example, as shown in FIG. 12, the micro vibration body 2 may have a shape in which, while the mounted surface 22b and the rim lower surface 211c are located on the same plane, the mounted surface 22b is not parallel to the suction surface 22a. In this case, for example, as shown in FIG. 13, in the inertial sensor 1, the height position of the rim lower surface 211c in the z direction becomes the same as the height position of the mounted surface 22b of the micro vibration body 2 in the left-right direction in the view of FIG. 13, when the mounted surface 22b of the micro vibration body 2 is arranged parallel to the mounting surface of the mounting substrate 3. In other words, in the inertial sensor 1, the areas of the rim 211, which are arranged to face the plurality of electrode portions 53, respectively, are all the same as each other. Therefore, even when the micro vibration body 2 is tilted with respect to the mounting substrate 3, the mounted surface 22b and the rim lower surface 211c are located on the same plane. Thus, the inertial sensor 1 has a configuration in which the variation in the areas of the rim 211 arranged to face the plurality of electrode portions 53 is reduced.

According to this modification, the same effect as that of the first embodiment can be produced.

Second Embodiment

Figure 14:
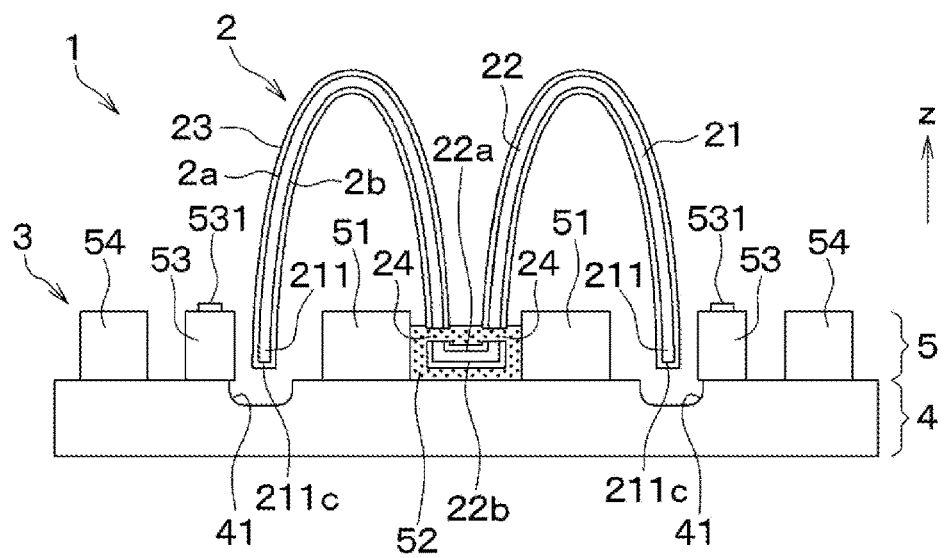
FIG. 14 is a cross-sectional view showing an inertial sensor according to a second embodiment.
Figure 15:
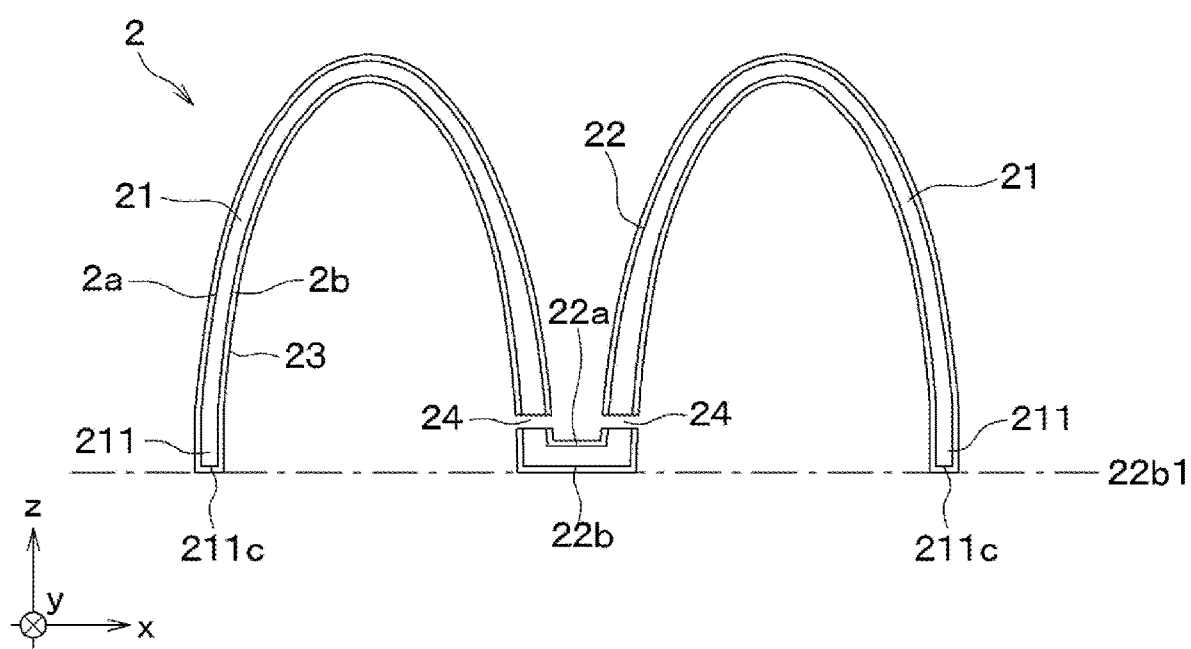
FIG. 15 is a cross-sectional view showing a micro vibration body of the inertial sensor according to the second embodiment.

The inertial sensor 1 of the second embodiment will be described with reference to FIGS. 14 and 15. FIG. 14 is a cross sectional view showing a cross section corresponding to FIG. 9. FIG. 15 is a cross sectional view showing a cross section corresponding to FIG. 3.

For example, as shown in FIG. 14, the inertial sensor 1 of the present embodiment is different from that of the first embodiment in that the micro vibration body 2 has a side through hole 24, which is a through hole formed in the side surface of the recessed portion 22 in the vicinity of the suction surface 22a, and in that the joining member 52 flows into the side through hole 24. This different point will be mainly described in the present embodiment.

For example, as shown in FIG. 15, the micro vibration body 2 of the present embodiment has, in the surface 2a, the side through hole 24 in the side surface of the recessed portion 22 in the vicinity of the bottom surface, that is, in the side wall portion in the vicinity of the suction surface 22a. The side through hole 24 connects the front surface 2a with the back surface 2b of the base material. The side through hole 24 is formed by, for example, irradiating a thin-walled base material (quartz or the like) constituting the micro vibration body 2 with a laser beam to partially melt the thin-walled base material 20. Further, the side through hole 24 may be formed by, for example, making a through hole in advance in a region of the quartz plate 20 located slightly outside the support portion M2 of the mold M in the process shown in FIG. 4A. As shown in FIG. 14, for example, the side through hole 24 is formed in the recessed portion 22 at a position lower than the height of the inner frame portion 51 in the z direction when the micro vibration body 2 is mounted on the mounting substrate 3. For example, two side through holes 24 are formed apart from each other at symmetrical positions in the top view. It is noted that, the number and the positions of the side through holes 24 are not limited to these and may be appropriately changed.

In the present embodiment, a part of the joining member 52 flows into the side through hole 24 of the micro vibration body 2 and may cover the bottom surface of the recessed portion 22 of the micro vibration body 2 on the side of the surface 2a, that is, may cover a part or the entirety of the suction surface 22a. In other words, even when the amount of the joining member 52 is large, a part of the joining member 52 flows into the side through hole 24 of the micro vibration body 2. Therefore, an excessive amount of the joining member 52 can be suppressed from being arising between the mounted surface 22b and the mounting surface of the mounting substrate 3. Further, in this case, the contact area between the micro vibration body 2 and the joining member 52 is increased as compared with the first embodiment, thereby to enable to enhance the joining strength of the micro vibration body 2.

According to the present embodiment, the inertial sensor 1 is configured to produce a similar effect to that of the first embodiment. Further, the side through hole 24 is formed in the micro vibration body 2. Therefore, even when the amount of the joining member 52 provided to the mounting substrate 3 is large, a part of the joining member 52 flows into the side through hole 24. Therefore, the configuration enables to prevent the joining member 52 from being interposed between the mounted surface 22b and the mounting surface of the mounting substrate 3 by an excessive amount. In addition, the configuration enables to prevent the micro vibration body 2 from tilting with respect to the mounting substrate 3. Further, when the joining member 52 also reaches the suction surface 22a, the contact area between the micro vibration body 2 and the joining member 52 increases, and the effect of improving the joining strength can also be produced.

Third Embodiment

Figure 16:
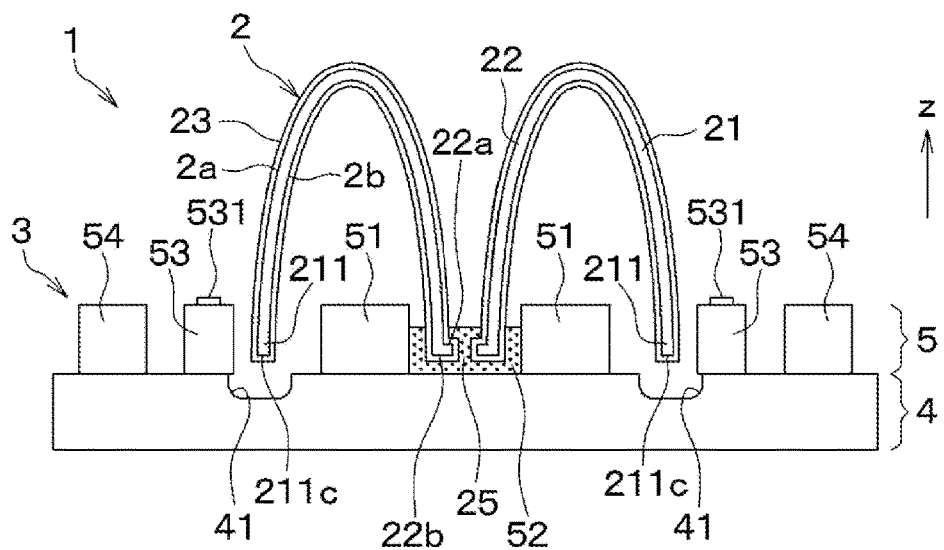
FIG. 16 is a cross-sectional view showing an inertial sensor according to a third embodiment.
Figure 17:
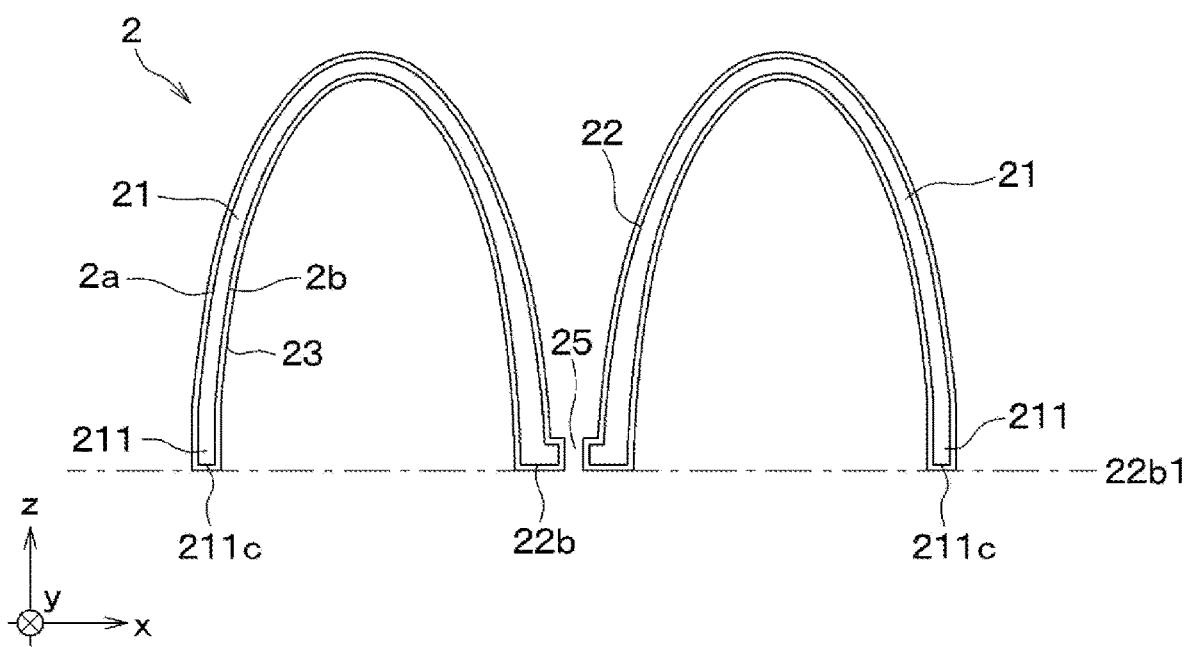
FIG. 17 is a cross-sectional view showing a micro vibration body of the inertial sensor according to the third embodiment.

The inertial sensor 1 of the third embodiment will be described with reference to FIGS. 6 to 8. FIG. 16 is a cross sectional view showing a cross section corresponding to FIG. 9. FIG. 17 is a cross sectional view showing a cross section corresponding to FIG. 3.

As shown in FIG. 16, in the inertial sensor 1 of the present embodiment, for example, the micro vibration body 2 has a bottom through hole 25 in the bottom surface of the recessed portion 22 in the z direction. The inertial sensor 1 of the present embodiment differs from that of the first embodiment in that the joining member 52 flows into the bottom through hole 25. This different point will be mainly described in the present embodiment.

Figure 18:
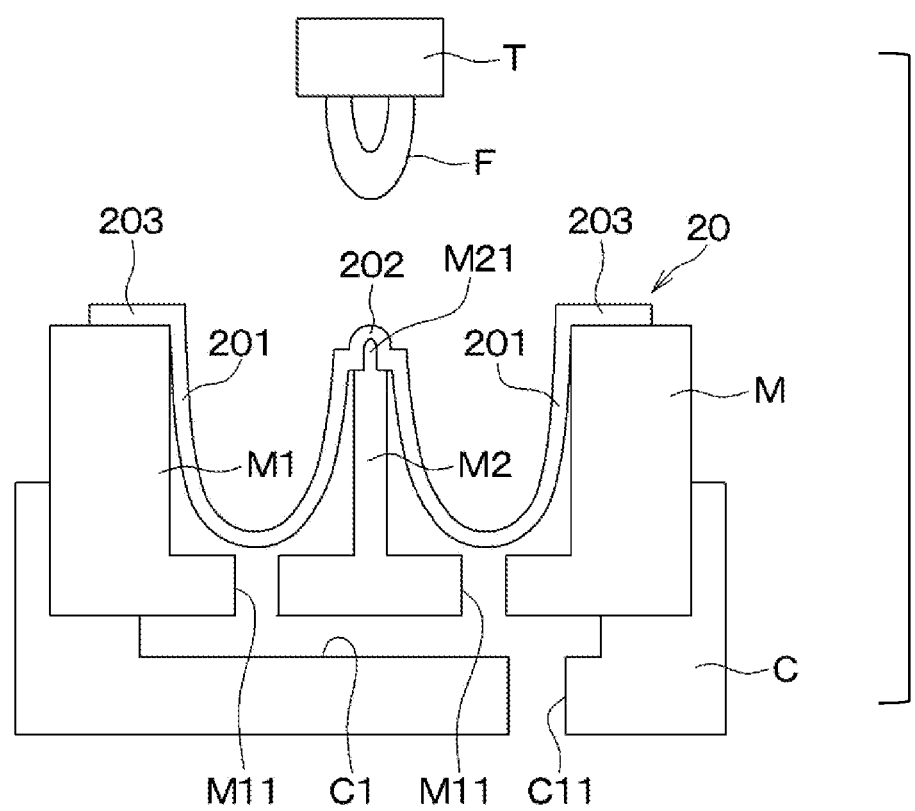
FIG. 18 is an explanatory view showing an example of a method for forming a bottom through hole according to the third embodiment.

In the present embodiment, as shown in FIG. 17, for example, the micro vibration body 2 is provided with the bottom through hole 25 communicating with the mounted surface 22b on the bottom surface of the recessed portion 22 in the z direction. The bottom through hole 25 is formed, for example, by a similar method to the method for forming the side through hole 24 of the second embodiment. Further, as shown in FIG. 18, the bottom through hole 25 may be formed by, for example, preparing, a mold M for molding having a protruding portion M21 at an upper end of the support portion M2 and polishing and removing an entirety of a portion of the recessed part 202 protruding due to the protruding portion M21. For example, one bottom through hole 25 is formed at the center position of the mounted surface 22b, but the present embodiment is not limited to this. A plurality of the bottom through holes 25 may be formed, or the bottom through hole 25 may be formed at a position different from the center position of the mounted surface 22b. The number and the position of bottom through hole(s) 25 may be appropriately changed.

In the present embodiment, a part of the joining member 52 flows into the bottom through hole 25 of the micro vibration body 2 and may cover a part or the entirety of the suction surface 22a in the bottom surface of the recessed portion 22 of the micro vibration body 2. As a result, as in the second embodiment, the present configuration enables to prevent the joining member 52 from interposing between the mounted surface 22b and the mounting surface of the mounting substrate 3 by an excessive amount. In addition, by increasing the contact area between the micro vibration body 2 and the joining member 52, the effect of enhancing the joining strength of the micro vibration body 2 can be produced. Further, the bottom through hole 25 is located in the mounted surface 22b, thereby to, even when an air bubble is present in the joining member 52, enable to cause the air bubble to easily escape to the outside through the bottom through hole 25. Thus, the present configuration enables to produce an effect to form more stable joining between the micro vibration body 2 and the mounting substrate 3.

According to the present embodiment, the inertial sensor 1 is configured to produce a similar effect to that of the first embodiment. Further, the micro vibration body 2 is provided with the bottom through hole 25, and a part of the joining member 52 flows into the bottom through hole 25. Therefore, the configuration enables to produce an effect of suppressing the inclination of the micro vibration body 2, reducing the influence of the air bubble on the joining member 52, and improving the joining strength between the micro vibration body 2 and the mounting substrate 3.

Modification of Third Embodiment

Figure 19:
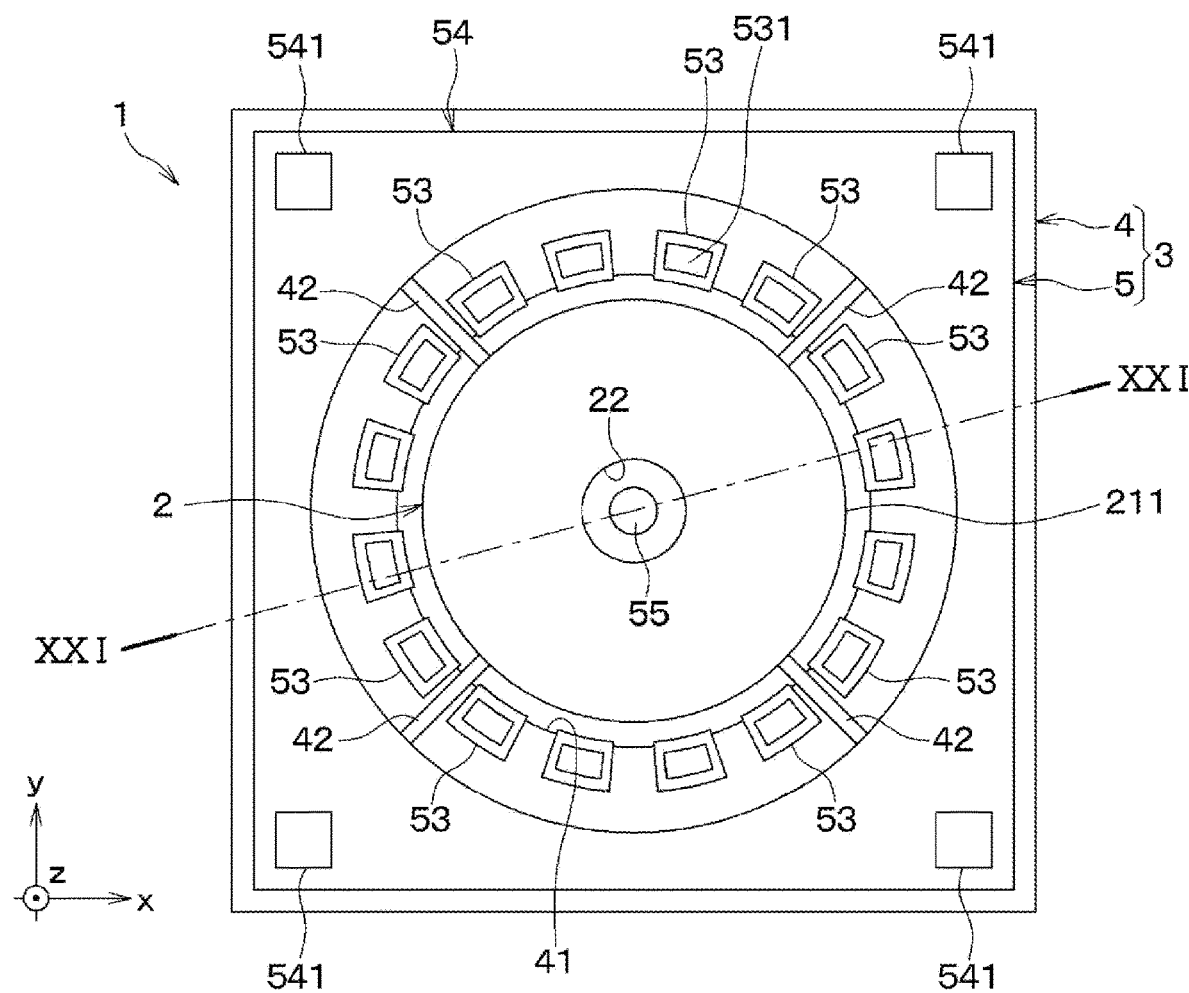
FIG. 19 is a top layout view showing a modified example of the inertial sensor according to the third embodiment.

As shown in FIG. 19, for example, the inertial sensor 1 of the third embodiment may have a configuration in which a column portion 55, which is a part of the mounting substrate 3, is inserted into the bottom through hole 25 of the micro vibration body 2.

Figure 20:
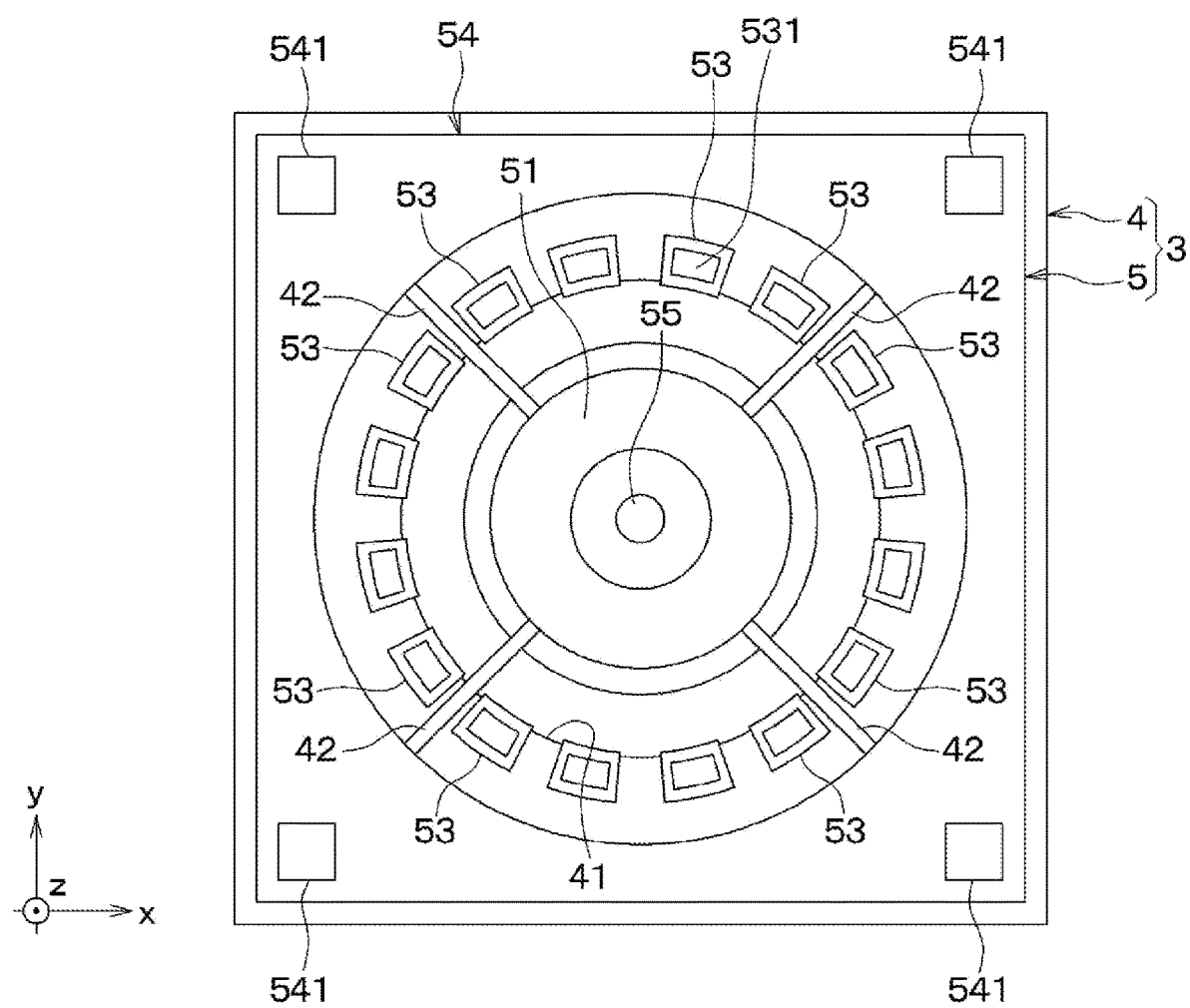
FIG. 20 is a top layout view showing the mounting substrate according to a modified example of the inertial sensor according to the third embodiment.
Figure 21:
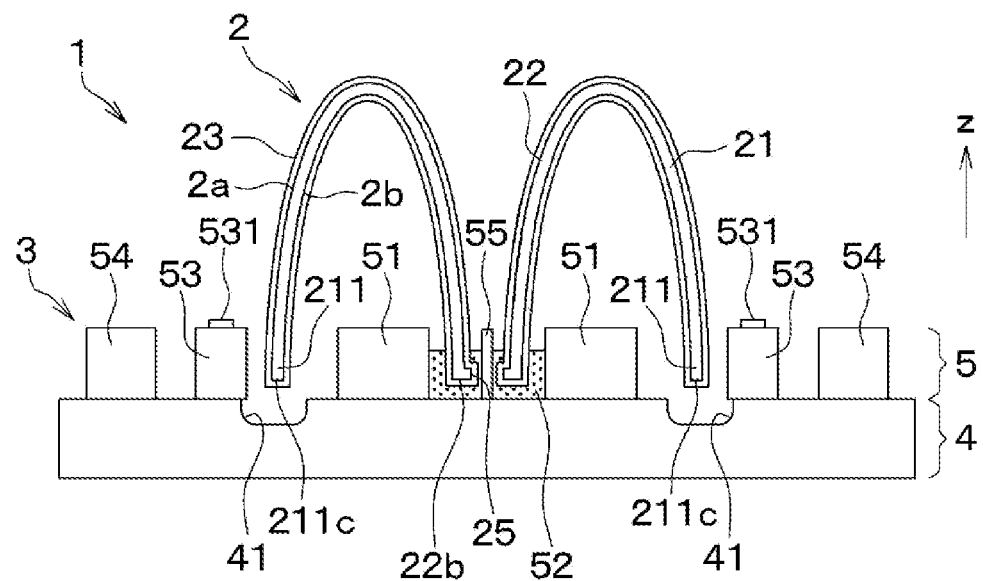
FIG. 21 is a cross-sectional view showing a cross-sectional configuration taken along a line XXI-XXI in FIG. 19.

Specifically, for example, as shown in FIG. 20, in the top view, the upper substrate 5 of the mounting substrate 3 may be configured to further include the column portion 55 arranged in the inner region surrounded by the inner frame portion 51, in a configuration where the bottom through hole 25 is formed in the micro vibration body 2. The column portion 55 has a diameter smaller than the inner diameter of the bottom through hole 25 and can be inserted into the bottom through hole 25. The column portion 55 is formed by, for example, etching at the same time as the forming of the inner frame portion 51, the electrode portion 53, and the outer frame portion 54. As shown in FIG. 21, for example, in the inertial sensor 1 according to the modified example, the micro vibration body 2 is joined to the mounting substrate 3 by the joining member 52 in the state where the column portion 55 is inserted into the bottom through hole 25. It is noted that, in a configuration where a plurality of bottom through holes 25 are provided, the mounting substrate 3 may have the same number of the column portions 55 as the bottom through holes 25.

According to this modification, the same effect as that of the third embodiment can be produced. Further, the column portion 55 is fitted into the bottom through hole 25 when the micro vibration body 2 is joined to the mounting substrate 3. Therefore, an effect of facilitating the positioning of the micro vibration body 2 with respect to the mounting substrate 3 can be produced.

Fourth Embodiment

Figure 22:
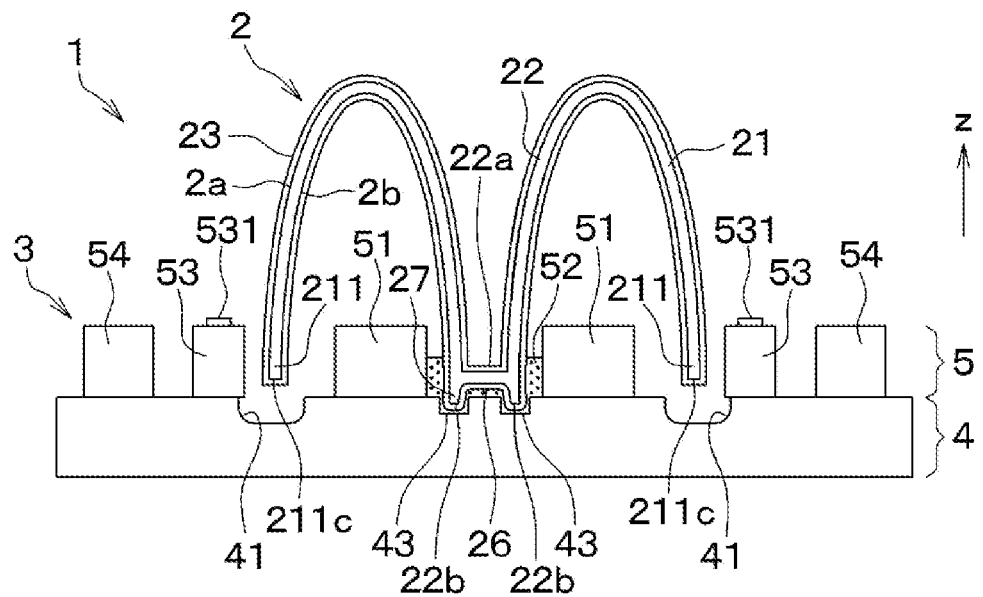
FIG. 22 is a cross-sectional view showing an inertial sensor according to a fourth embodiment.
Figure 23:
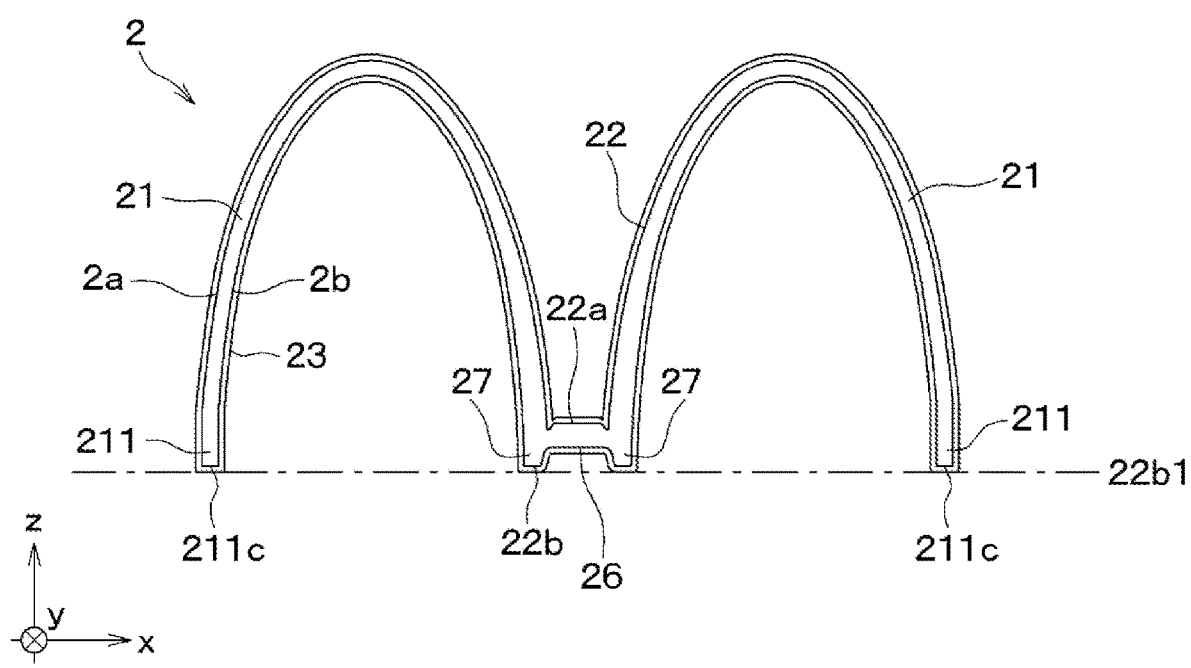
FIG. 23 is a cross-sectional view showing a micro vibration body of the inertial sensor according to the fourth embodiment.

The inertial sensor 1 of the fourth embodiment will be described with reference to FIGS. 22 to 24. FIG. 22 is a cross sectional view showing a cross section corresponding to FIG. 9. FIG. 23 is a cross sectional view showing a cross section corresponding to FIG. 3.

As shown in FIG. 22, for example, the inertial sensor 1 of the present embodiment differs from the first embodiment in that the recessed portion 22 of the micro vibration body 2 has a mounted surface recess 26, which is on the side of the mounted surface 22b and is recessed toward the surface 2a, and in that the positioning groove 43 is formed on the mounting substrate 3. This different point will be mainly described in the present embodiment.

In the present embodiment, as shown in FIG. 23, for example, the micro vibration body 2 has the mounted surface recess 26, which is located at the bottom of the recessed portion 22 and on the side of the mounted surface 22b and is recessed toward the front surface 2a. In the micro vibration body 2, a protruding portion 27 protrudes from a bottom surface of the mounted surface recess 26. A tip end surface of the protruding portion 27 is the mounted surface 22b that is located on the same plane as the rim lower surface 211c.

Figure 24:
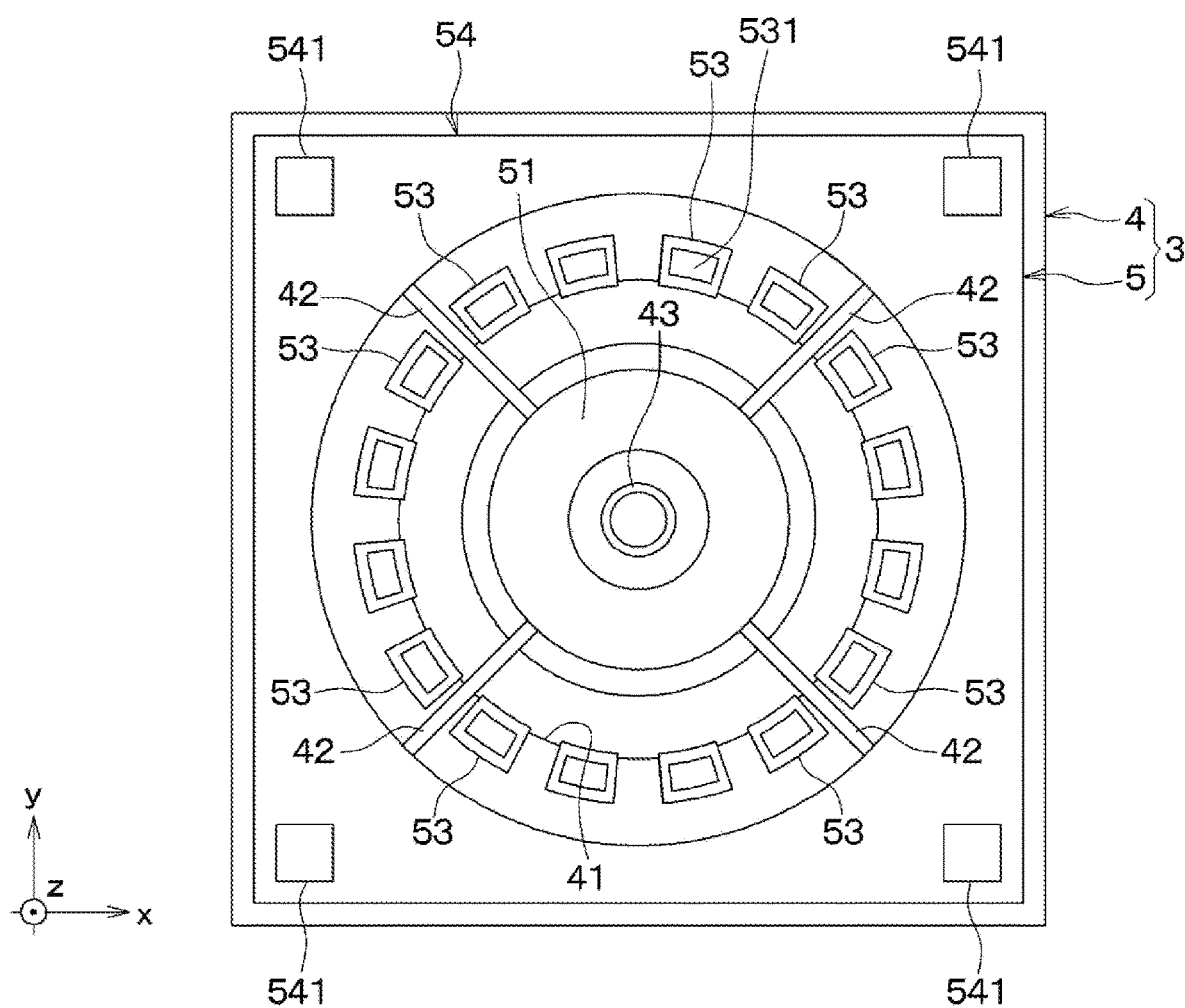
FIG. 24 is a top layout view showing the mounting substrate of the inertial sensor according to the fourth embodiment.

In the present embodiment, for example, as shown in FIG. 24, the mounting substrate 3 is formed with the annular positioning groove 43 at a position that is in the inner region of the lower substrate 4 surrounded by the inner frame portion 51 and that corresponds to the protruding portion 27 of the micro vibration body 2 The positioning groove 43 is formed, for example, at the same time as the etching groove 41 in an etching process using a DRIE or the like. As shown in FIG. 22, for example, the positioning groove 43 has a width that allows the protruding portion 27 of the micro vibration body 2 to enter. The positioning groove 43 facilitates the positioning of the micro vibration body 2 with respect to the mounting substrate 3.

Figure 25A:
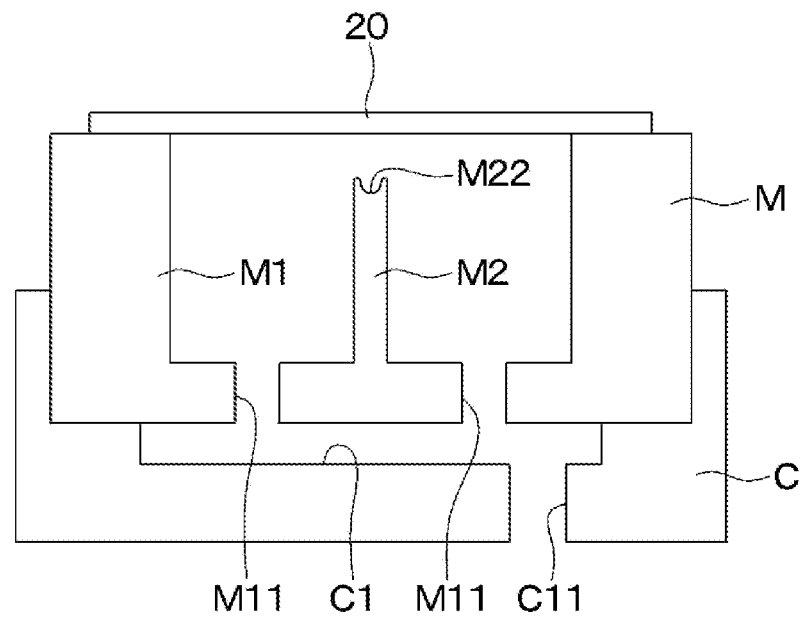
FIG. 25A is a view showing a process for preparing a member in molding of the micro vibration body shown in FIG. 22.
Figure 25B:
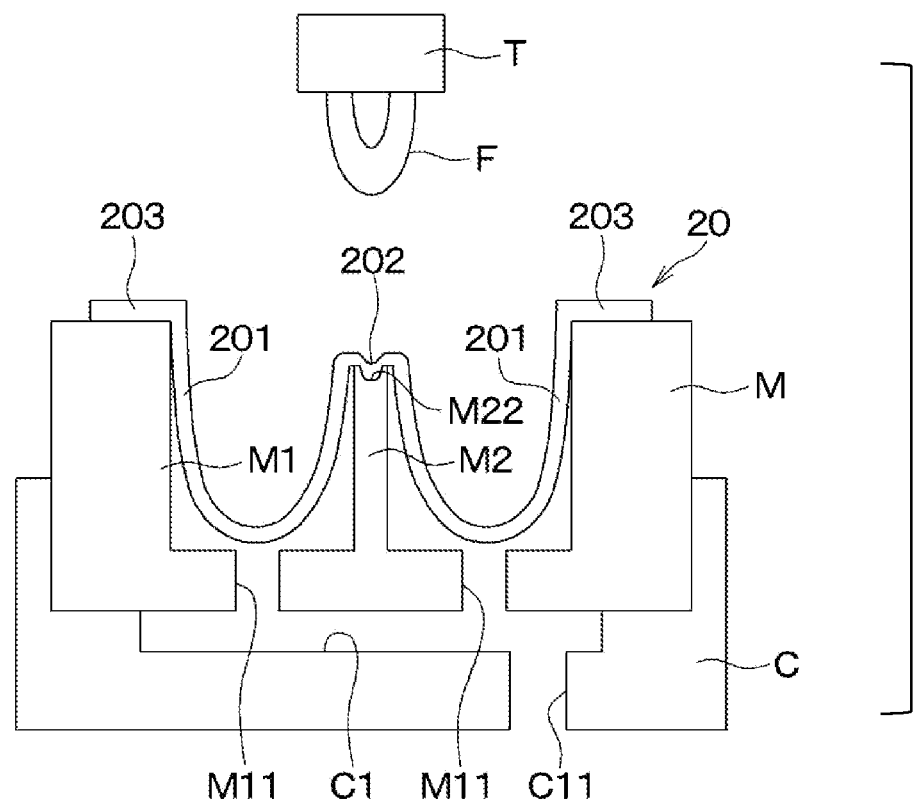
FIG. 25B is a view showing a process following the process of FIG. 24A.

The micro vibration body 2 of the present embodiment is formed, for example, through the process shown in FIGS. 25A and 25B. First, as shown in FIG. 25A, a mold M is prepared for forming a three-dimensional curved surface. The mold M has a recessed portion M22 on a tip surface of the support portion M2. Subsequently, the quartz plate 20 is melted by a flame F to form the curved surface part 201 and the recessed part 202. At this time, as shown in FIG. 25B, the recessed part 202 follows the shape of the recessed portion M22 to have a shape corresponding to the mounted surface recess 26 and the protruding portion 27.

An example of manufacturing the micro vibration body 2 using the mold M having the recessed portion M22 as the support portion M2 has been described. The manufacturing the micro vibration body 2 is not limited to this method. For example, a mold having a through hole instead of the recessed portion M22 may be used. The through hole communicates with the bottom surface side of the fitting portion C1 of the cooling body C. In this case, the mounted surface recess 26 may be formed by evacuation. The method of forming the mounted surface recess 26 may be appropriately changed.

According to the present embodiment, the inertial sensor 1 is configured to produce a similar effect to that of the first embodiment. Further, in this inertial sensor 1, the micro vibration body 2 has the mounted surface recess 26, and the protruding portion 27 of the micro vibration body 2 is inserted into the positioning groove 43 of the mounting substrate 3. Therefore, an effect of facilitating the positioning of the micro vibration body 2 can also be produced.

Modification of Fourth Embodiment

Figure 26:
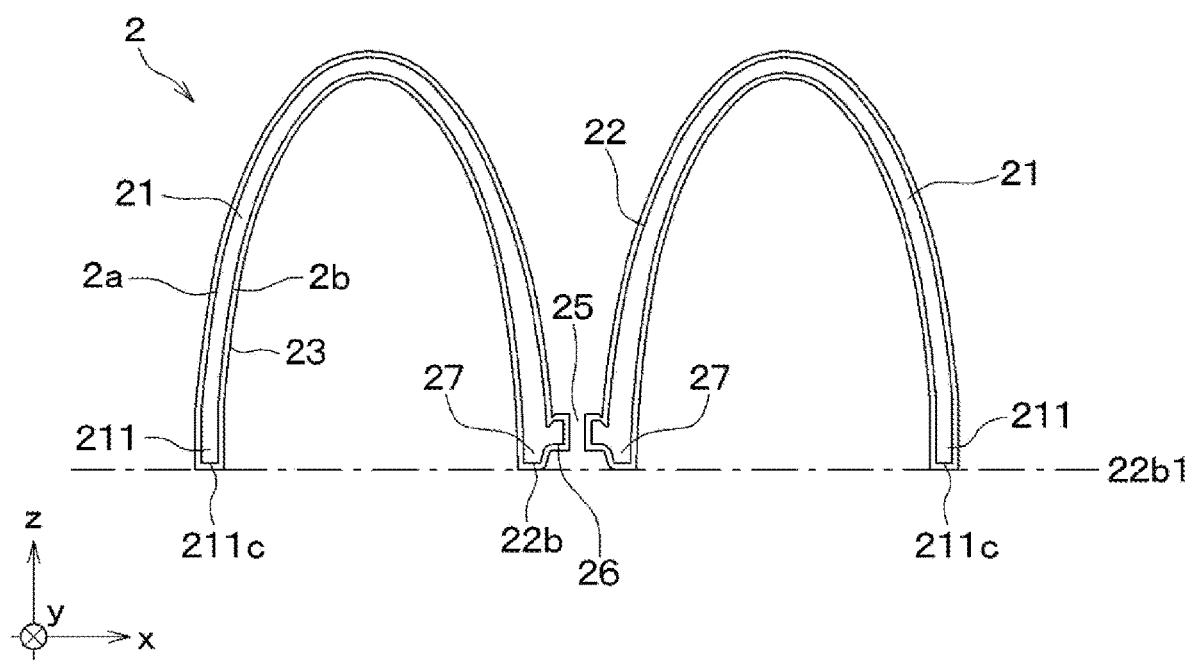
FIG. 26 is a cross-sectional view showing a micro vibration body of a modified example of the inertial sensor according to the fourth embodiment.
Figure 27:
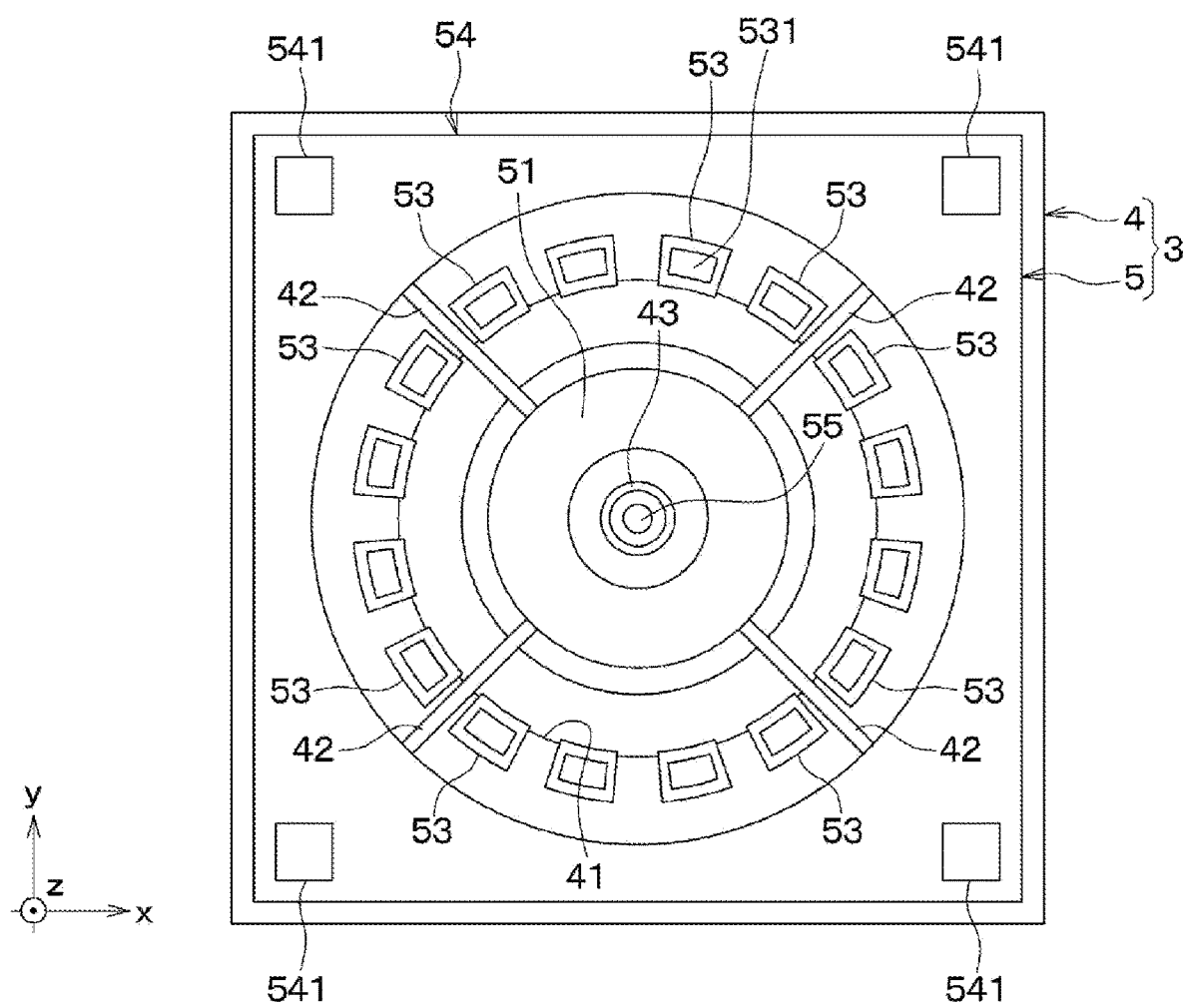
FIG. 27 is a top layout view showing the mounting substrate according to the modified example of the inertial sensor according to the fourth embodiment.
Figure 28:
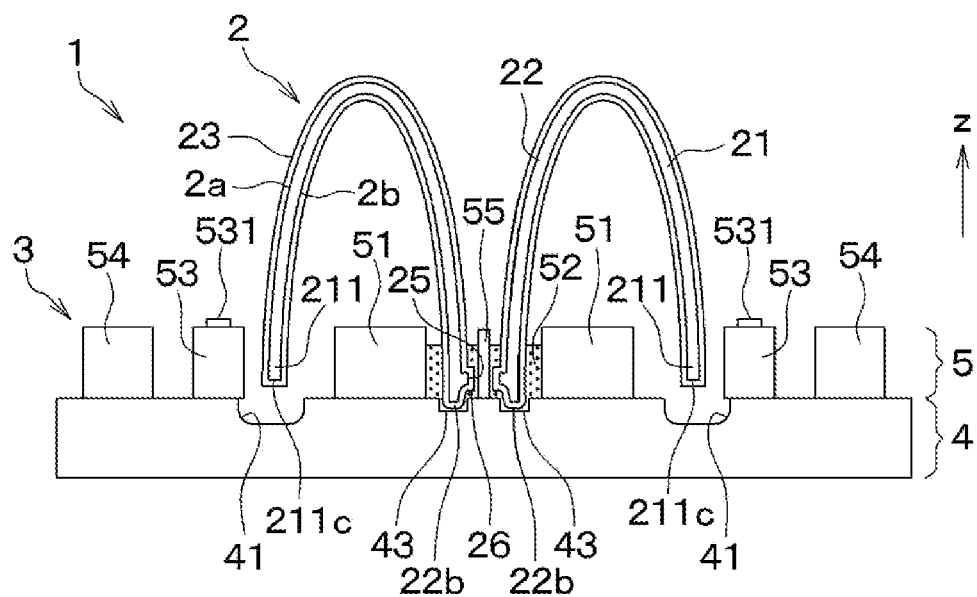
FIG. 28 is a cross-sectional view showing a modified example of the inertial sensor of the fourth embodiment.

In the inertial sensor 1 of the fourth embodiment, for example, as shown in FIG. 26, the micro vibration body 2 may further have the bottom through hole 25 in the mounted surface recess 26. As shown in FIG. 27, the mounting substrate 3 may further have the column portion 55. Further, the bottom through hole 25 and the mounted surface recess 26 may be joined to each other. In the inertial sensor 1, for example, as shown in FIG. 28, the column portion 55 of the mounting substrate 3 is inserted into the bottom through hole 25 of the micro vibration body 2.

According to this modification, in addition to the effect of the fourth embodiment, an effect of enhancing the positioning accuracy of the micro vibration body 2 by inserting the column portion 55 into the bottom through hole 25 and an effect of reducing the influence of the air bubble in the joining member 52 can be produced.

Figure 29:
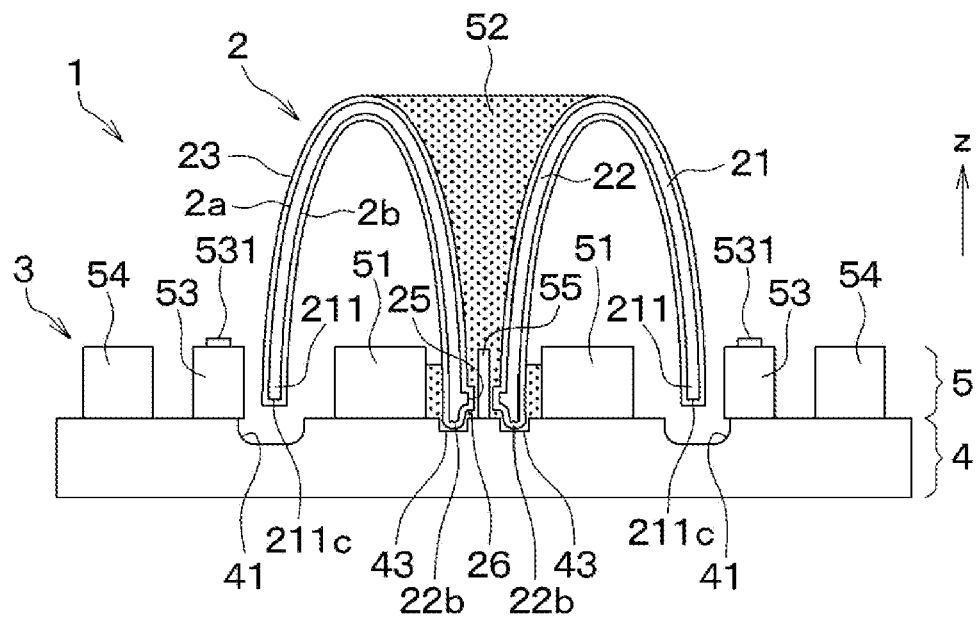
FIG. 29 is a cross-sectional view showing another modified example of the inertial sensor of the fourth embodiment.

As shown in FIG. 29, for example, the inertial sensor 1 according to this modification may have a configuration in which the recessed portion 22 is filled with the joining member 52. The recessed portion 22 is filled with the joining member 52. Therefore, the inertial sensor 1 has a configuration that enables connecting of a wire (not shown) to the joining member 52 on the upper side in the z direction. For example, the inertial sensor 1 has a configuration that enables to directly connect one of the plurality of electrode films 541 on the upper surface of the outer frame portion 54 with the joining member 52 that fills the recessed portion 22 via a wire. In this case, the mounting substrate 3 does not require the bridge wiring 42.

Figure 30:
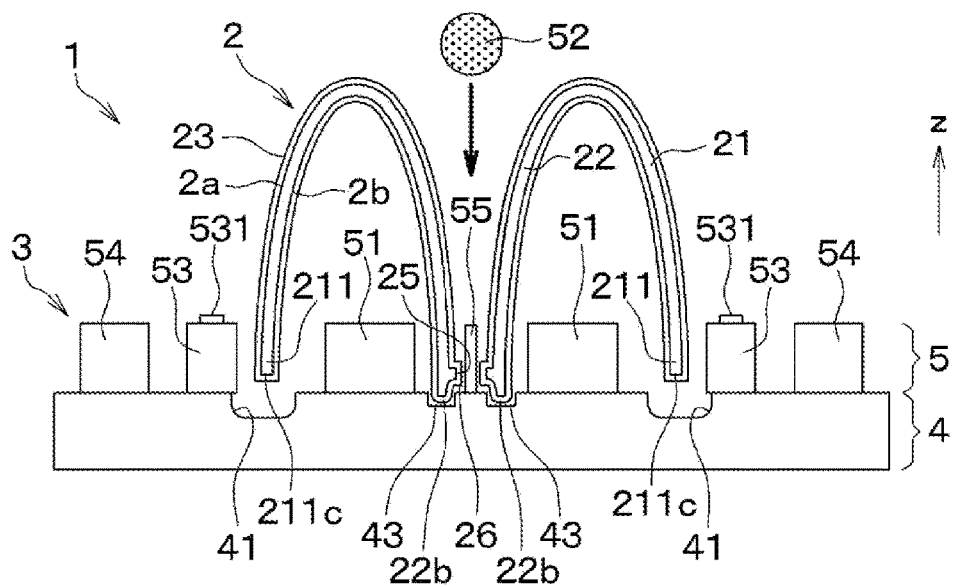
FIG. 30 is a view showing a mounting process of the micro vibration body in manufacturing of the inertial sensor of FIG. 29 and is an explanatory view showing the mounting process of the micro vibration body on the mounting substrate, and a subsequent process of filling the joining member.

For example, as shown in FIG. 30, the inertial sensor 1 of FIG. 29 can be manufactured by attaching the micro vibration body 2, which has the bottom through hole 25 and the mounted surface recess 26, to the mounting substrate 3, which has the positioning groove 43 and the column portion 55, and thereafter, by pouring the joining member 52 into the recessed portion 22, and by solidifying the joining member 52. Even with such a configuration, a similar effect to that of the above-described modification can be produced. Further, the joining area between the joining member 52 and the micro vibration body 2 is increased. Therefore, an effect of further enhancing the bonding strength between the micro vibration body 2 and the mounting substrate 3 can be produced. Further, the joining member 52 is poured into the recessed portion 22 to join the micro vibration body 2 to the mounting substrate 3, after the micro vibration body 2 is attached to the mounting substrate 3. Therefore, the micro vibration body 2 is not placed on the joining member 52 in a fluidic state, and thus, the inclination caused by the joining member 52 is prevented.

Other Embodiments

Although the present disclosure has been described in accordance with the examples, it is understood that the present disclosure is not limited to such examples or structures. The present disclosure also includes various modifications and modifications within an equivalent range. In addition, various combinations and modes, and further, other combinations and modes including one element of these alone, or thereabove, or therebelow, are also comprised within the scope or concept range of the present disclosure.

(1) For example, an example of the inertial sensor 1 in which the mounting substrate 3 has both the positioning groove 43 and the column portion 55 has been described with reference to FIG. 29. However, the micro vibration body 2 may not have the mounted surface recess 26, and the mounting substrate 3 may not have the positioning groove 43.

Figure 31:
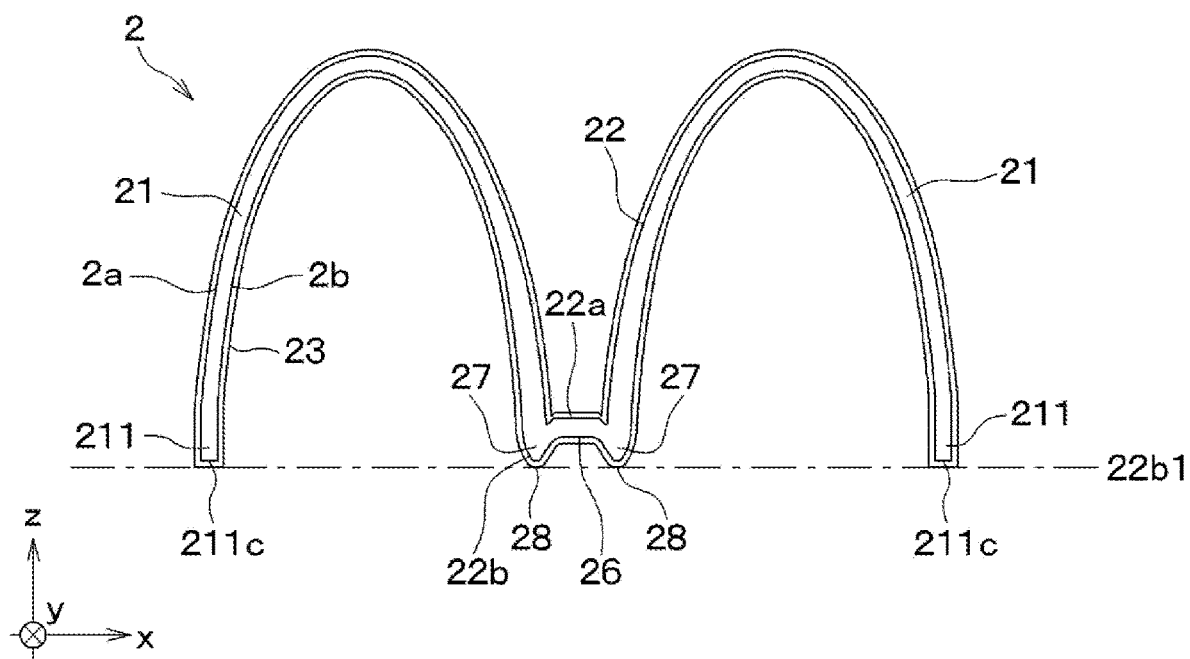
FIG. 31 is a cross sectional view showing another example of a shape of the micro vibration body.

(2) As shown in FIG. 31, for example, in the inertial sensor 1 according to the fourth embodiment and the modification of the fourth embodiment, the entire area of the protruding portion 27 of the micro vibration body 2 may have a curbed bowl shape and may not have a flat surface portion in the cross sectional view. In this case, the protruding portion 27 of the micro vibration body 2 has a tip end portion 28 at the apex. The tip end portion 28 has, for example, an annular shape and is located in the same plane as the rim lower surface 211c. In other words, when the micro vibration body 2 is mounted to the mounting substrate 3, the mounted surface 22b of the protruding portion 27 is not in surface contact with the mounting board 3, but the tip end portion 28 is in line contact with the mounting substrate 3.

The micro vibration body 2 may be manufactured generally with a process similar to the fourth embodiment, excluding the process of removing the tip end portion 203, on which the rim lower surface 211c is formed, is stopped when reaching the apex of the protruding portion 27. For example, the configuration of the micro vibration body 2 may be made by, in the process of removing the tip end portion 203 shown in FIG. 25B, grinding the tip end portion 203 by a distance between the surface of the mold M, which is in contact with the quartz plate 20, and the tip end surface of the support portion M2. The tip end portion 203 may be ground by a distance less than the distance, such that the tip end portion 28 remains without being ground.

What is claimed is:

1. An inertial sensor comprising:
a micro vibration body that is a thin-walled member having a front surface, which is a surface on a side having a large outer diameter, and a back surface, which is an opposite surface to the front surface and having a smaller diameter than the front surface, the micro vibration body including a curved surface portion, which has an annular curved surface, and a recessed portion, which is recessed from the curved surface portion toward the back surface;
a mounting substrate that includes a lower substrate and an upper substrate, which are joined to each other, the upper substrate including an inner frame portion, which has a frame-shape, and a plurality of electrode portions, which are separated from each other and surround an inner frame portion; and
a joining member that is provided in an inner region of the mounting substrate, which is surrounded by the inner frame portion, wherein
the recessed portion of the micro vibration body has a bottom surface defining a mounted surface on a side of the back surface,
the mounted surface is located in the inner region and is joined to the mounting substrate via the joining member,
the curved surface portion has a rim that is in a hollow state,
the rim is a part of the curved surface portion and includes an end portion of the curved surface portion on an opposite side to the recessed portion,
the rim has a rim lower surface, which is a surface connecting the front surface with the back surface, and
the rim lower surface is located on a same plane as the mounted surface or a tip end portion of the mounted surface.

2. The inertial sensor according to claim 1, wherein
the mounted surface of the micro vibration body has a mounted surface recess recessed from the back surface toward the front surface,
the mounting substrate has a positioning groove that corresponds to a protruding portion of the micro vibration body,
the protruding portion protrudes from the mounted surface recess toward the mounted surface, and
the protruding portion is inserted in the positioning groove.

3. The inertial sensor according to claim 1, wherein
the micro vibration body has a side through hole provided in a side surface of the recessed portion in the front surface,
the side through hole is provided near the bottom surface and is configured to connect the front surface with the back surface, and
the joining member at least partially enters the side through hole.

4. The inertial sensor according to claim 1, wherein
the micro vibration body has a bottom through hole provided in the mounted surface, and
the joining member at least partially enters the bottom through hole.

5. The inertial sensor according to claim 2, wherein
the micro vibration body has a bottom through hole provided in a bottom surface of the mounted surface recess, and
the joining member at least partially enters the bottom through hole.

6. The inertial sensor according to claim 4, wherein
the mounting substrate has a column portion in a region surrounded by the inner frame portion, and
the column portion is inserted in the bottom through hole.

* * * * *